United States Patent
Morimoto et al.

(10) Patent No.: US 11,309,442 B2
(45) Date of Patent: Apr. 19, 2022

(54) PHOTODETECTION DEVICE AND PHOTODETECTION SYSTEM

(71) Applicant: CANON KABUSHIKI KAISHA, Tokyo (JP)

(72) Inventors: Kazuhiro Morimoto, Tokyo (JP); Hajime Ikeda, Yokohama (JP); Junji Iwata, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 5 days.

(21) Appl. No.: 16/662,713

(22) Filed: Oct. 24, 2019

(65) Prior Publication Data

US 2020/0058808 A1 Feb. 20, 2020

Related U.S. Application Data

(63) Continuation of application No. 15/656,490, filed on Jul. 21, 2017, now Pat. No. 10,497,818.

(30) Foreign Application Priority Data

Jul. 29, 2016 (JP) .............................. JP2016-150330
Jul. 29, 2016 (JP) .............................. JP2016-150331

(51) Int. Cl.
*H01L 31/18* (2006.01)
*H01L 31/0224* (2006.01)
(Continued)

(52) U.S. Cl.
CPC ........ *H01L 31/022408* (2013.01); *G01J 1/44* (2013.01); *H01G 9/2027* (2013.01);
(Continued)

(58) Field of Classification Search
CPC ..... H01L 31/022416; H01L 31/035272; H01L 31/1804; H01L 31/107; H01L 31/02161; H01L 27/14812; G01J 1/44; H01G 9/2027

See application file for complete search history.

(56) References Cited

U.S. PATENT DOCUMENTS

2006/0077380 A1* 4/2006 Ohtomo .............. G01C 15/006
356/141.1
2010/0148040 A1 6/2010 Sanfilippo
(Continued)

FOREIGN PATENT DOCUMENTS

CN 101432893 A 5/2009
CN 103545328 A 1/2014
(Continued)

*Primary Examiner* — Tony Ko
(74) *Attorney, Agent, or Firm* — Canon U.S.A., Inc. IP Division

(57) ABSTRACT

A semiconductor substrate has a first surface and a second surface which is opposite to the first surface. A photoelectric conversion portion has a PN junction configured with first and second semiconductor regions of different conductivity types. A buried portion is buried in the semiconductor substrate and includes an electrode and a dielectric member located between the electrode and the semiconductor substrate and in contact with the second semiconductor region. The second semiconductor region is located in a position deeper than the first semiconductor region. The buried portion is located to extend from a first surface to a position deeper than the first semiconductor region. Electric potentials are supplied to the first semiconductor region, the second semiconductor region, and the electrode in such a manner that an inversion layer occurring between the electrode and the second semiconductor region and the first semiconductor region are in contact with each other.

16 Claims, 22 Drawing Sheets

(51) Int. Cl.
    *H01L 31/0352*     (2006.01)
    *H01L 31/107*     (2006.01)
    *H01L 31/0216*     (2014.01)
    *G01J 1/44*     (2006.01)
    *H01G 9/20*     (2006.01)
    *H01L 27/148*     (2006.01)
    *H01L 31/062*     (2012.01)

(52) U.S. Cl.
    CPC .. *H01L 27/14812* (2013.01); *H01L 31/02161* (2013.01); *H01L 31/022416* (2013.01); *H01L 31/035272* (2013.01); *H01L 31/062* (2013.01); *H01L 31/107* (2013.01); *H01L 31/18* (2013.01); *H01L 31/1804* (2013.01)

(56) References Cited

U.S. PATENT DOCUMENTS

2013/0062604 A1     3/2013     Kautzsch

2018/0026147 A1*     1/2018     Zhang ............. H01L 31/022416
    257/292

FOREIGN PATENT DOCUMENTS

| | | |
|---|---|---|
| CN | 203385484 U | 1/2014 |
| CN | 103975581 A | 8/2014 |
| CN | 104465683 A | 3/2015 |
| CN | 105474045 A | 4/2016 |
| JP | 2002-90116 A | 3/2002 |
| JP | 2009-20109 A | 1/2009 |
| JP | 2009-020109 A | 1/2009 |
| JP | 2009-525619 A | 7/2009 |
| JP | 2009-535821 A | 10/2009 |
| JP | 2015-38435 A | 2/2015 |
| JP | 2015-56622 A | 3/2015 |
| JP | 2015-056622 A | 3/2015 |
| JP | 2015-84392 A | 4/2015 |
| JP | 2015-084392 A | 4/2015 |

\* cited by examiner

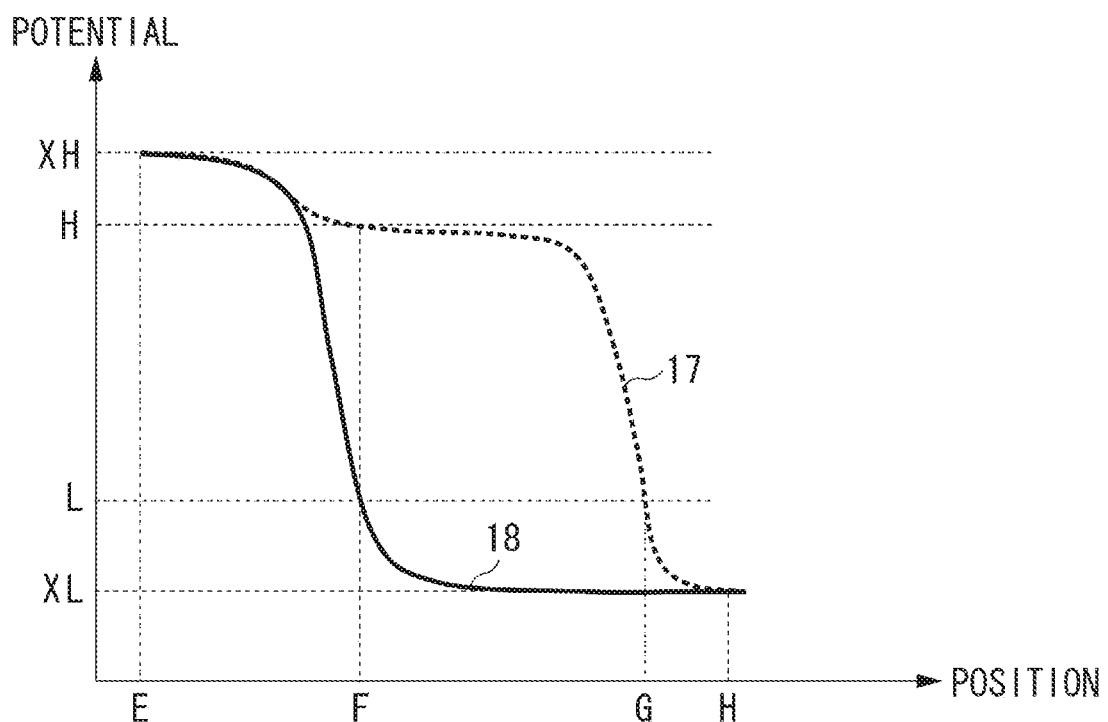

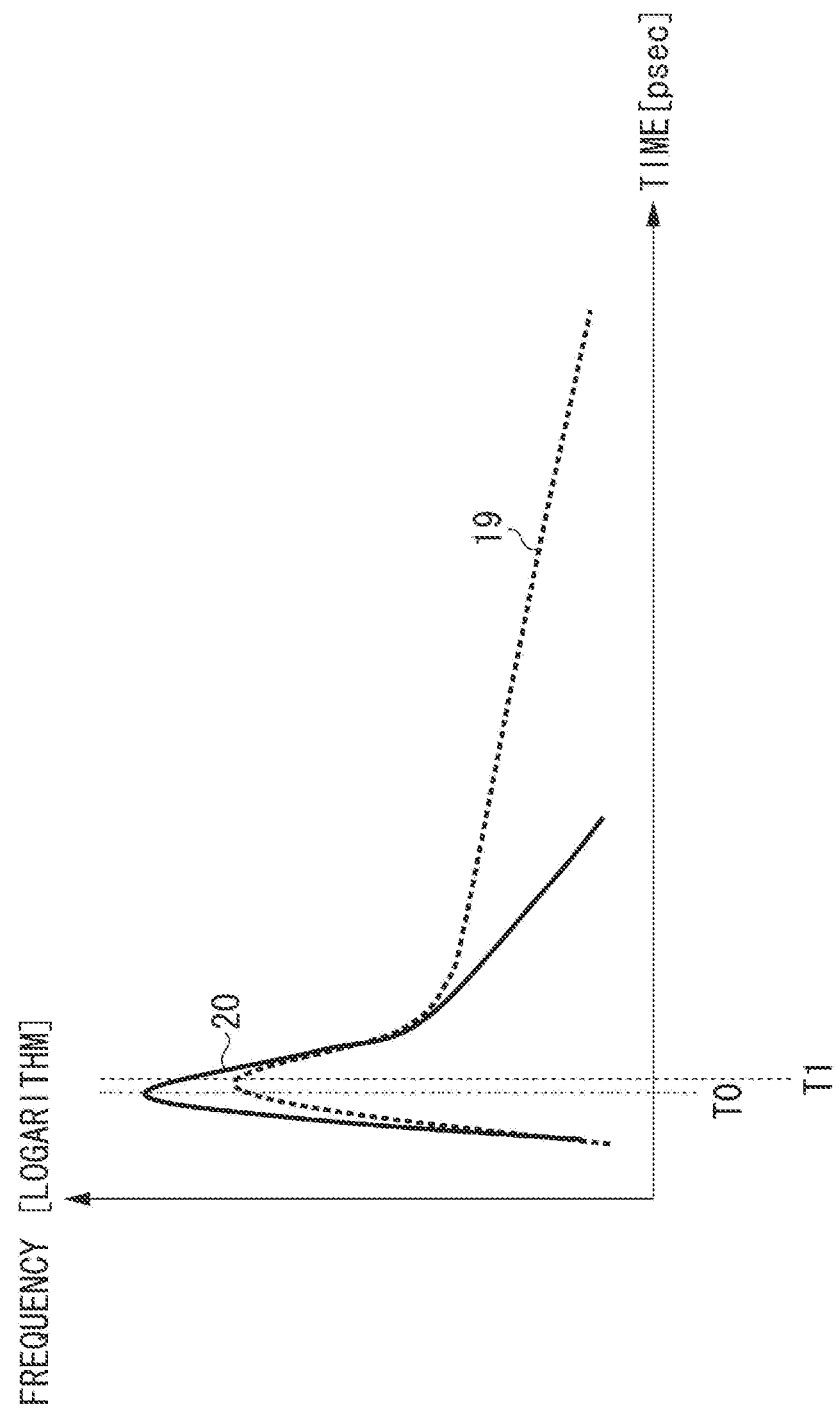

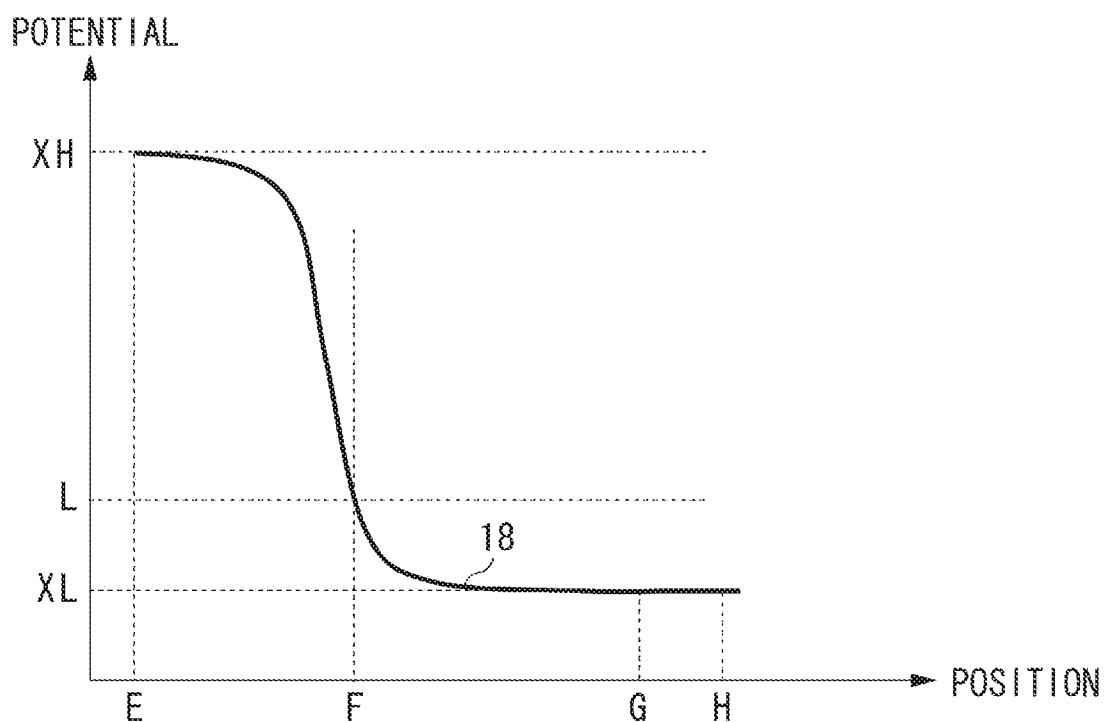

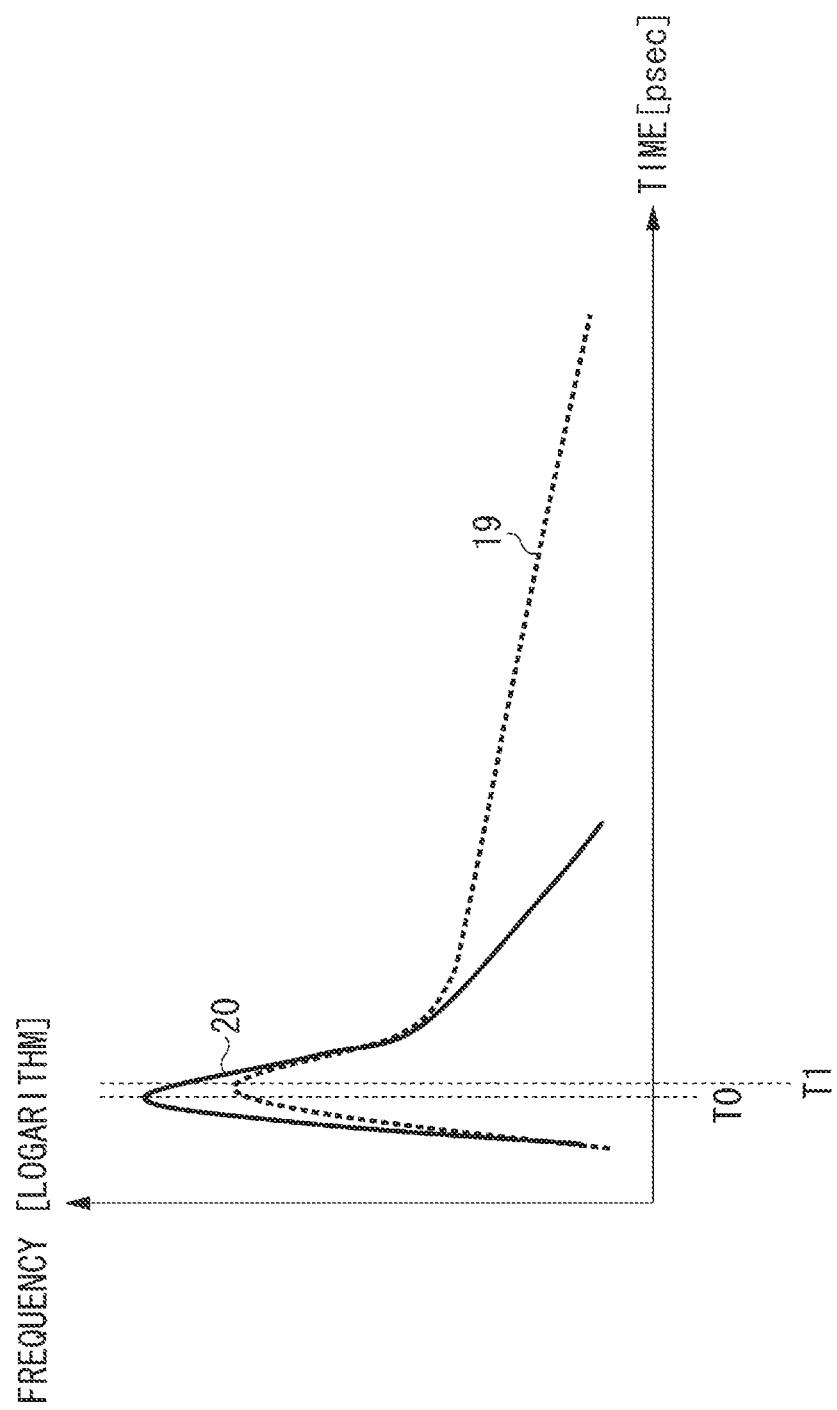

PHOTODETECTION DEVICE AND PHOTODETECTION SYSTEM

This application is a Continuation of U.S. application Ser. No. 15/656,490, filed Jul. 21, 2017, which claims priority from Japanese Patent Application Nos. 2016-150330 filed Jul. 29, 2016, and 2016-150331 filed Jul. 29, 2016, which are hereby incorporated by reference herein in their entirety.

BACKGROUND OF THE INVENTION

Field of the Invention

Aspects of the embodiments generally relate to a photodetection device and a photodetection system each of which is configured to perform photoelectric conversion.

Description of the Related Art

Heretofore, there is known a photodetection device that is capable of detecting weak light in the level of a single photon using avalanche (electron avalanche) multiplication. Japanese Patent Application Laid-Open No. 2014-225647 discusses a pixel having a single-photon avalanche diode (SPAD) in which a photocarrier generated from a single photon triggers avalanche amplification in a PN junction region of a semiconductor region constituting a photoelectric conversion portion. Furthermore, the SPAD discussed in Japanese Patent Application Laid-Open No. 2014-225647 has a deep trench isolation (DTI) structure, in which a photoelectric conversion portion and a quenching circuit are isolated from each other, and therefore can prevent leak current between pixels in a case where a plurality of pixels each of which is miniaturized is arranged.

The SPAD discussed in Japanese Patent Application Laid-Open No. 2014-225647 has a PN junction region, which serves as a region for detecting an electric charge, in the vicinity of the surface of a semiconductor substrate. An electric charge generated in a deep portion of the semiconductor substrate when light is incident thereon moves to the PN junction region due to diffusion. Therefore, the electric charge generated in the deep portion of the semiconductor substrate might require a longer time from the generation of the electric charge to the induced movement to the PN junction region than an electric charge generated on the surface of the semiconductor substrate.

SUMMARY OF THE INVENTION

Aspects of the embodiments are generally directed to a photodetection device that is capable of reducing a time required to detect an electric charge generated in a deep portion of a semiconductor substrate.

According to an aspect of the embodiments, a photodetection device includes a semiconductor substrate, a photoelectric conversion portion, and a buried portion. The semiconductor substrate has a first surface and a second surface which is opposite to the first surface. The photoelectric conversion portion has a PN junction configured with a first semiconductor region and a second semiconductor region of a conductivity type different from that of the first semiconductor region. The buried portion is buried in the semiconductor substrate and includes an electrode and a dielectric member which is located between the electrode and the semiconductor substrate and is in contact with the second semiconductor region. The second semiconductor region is located in a position deeper than the first semiconductor region with respect to the first surface. The buried portion is located to extend from the first surface to a position deeper than the first semiconductor region with respect to the first surface. Electric potentials are supplied to the first semiconductor region, the second semiconductor region, and the electrode in such a manner that an inversion layer occurring between the electrode and the second semiconductor region and the first semiconductor region are in contact with each other.

Further features of the disclosure will become apparent from the following description of exemplary embodiments with reference to the attached drawings.

BRIEF DESCRIPTION OF THE DRAWINGS

FIG. 5 is a potential structure diagram in a line segment EH.

FIG. 6 illustrates a photoresponsivity performance.

FIG. 16 is a potential structure diagram in a line segment EH.

FIG. 17 illustrates a photoresponsivity performance.

DESCRIPTION OF THE EMBODIMENTS

Figure 1:
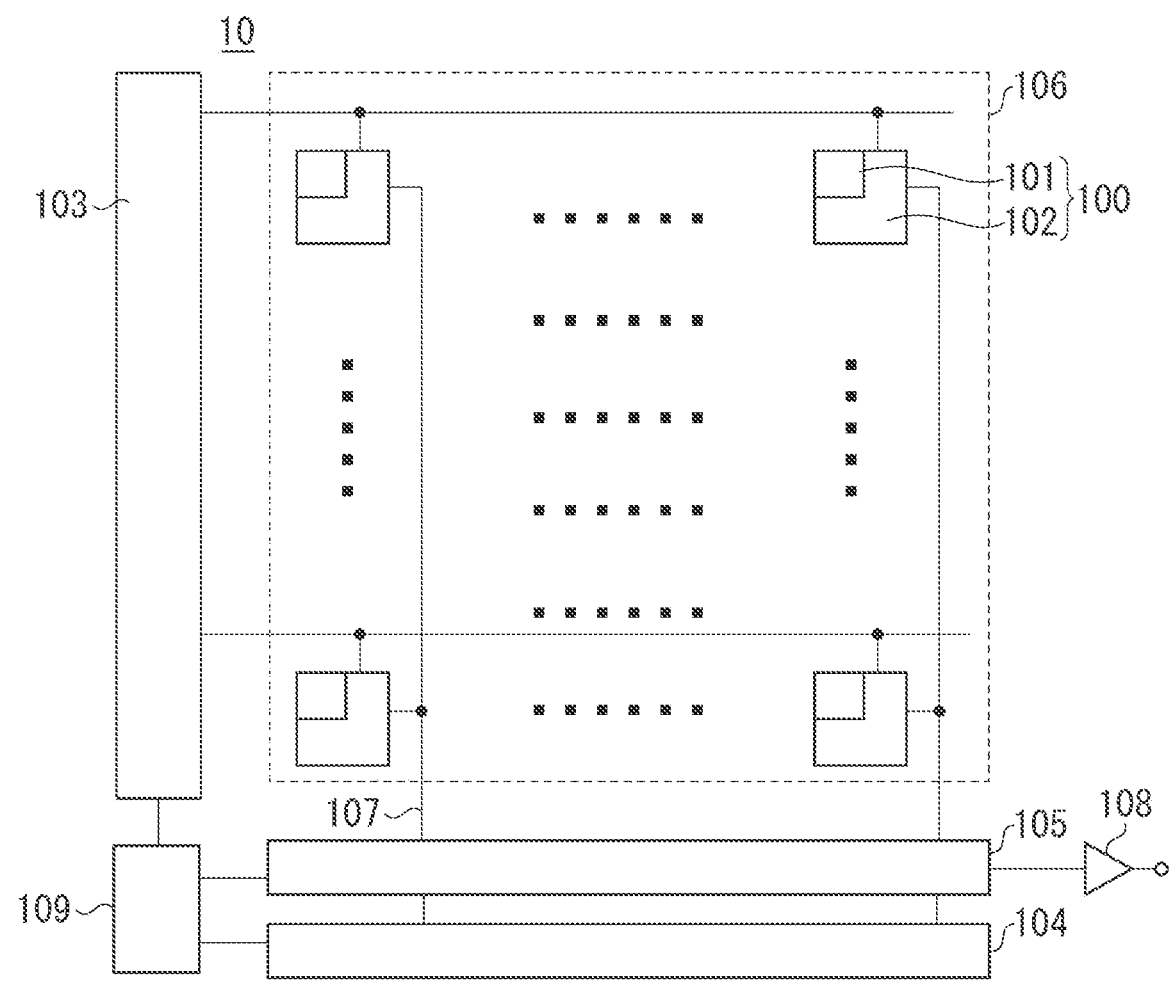
FIG. 1 is a block diagram of a photodetection device according to a first exemplary embodiment.

A photodetection device according to a first exemplary embodiment is described with reference to FIG. 1 to FIG. 6.

Portions having the same reference characters assigned thereto indicate the respective same elements or the respective same regions.

FIG. 1 is a block diagram of a photodetection device 10 according to the first exemplary embodiment. The photodetection device 10 includes a pixel portion 106, a control pulse generation portion 109, a horizontal scanning circuit portion 104, a column circuit 105, signal lines 107, and a vertical scanning circuit portion 103.

The pixel portion 106 includes a plurality of pixels 100 arranged in a matrix manner. Each pixel 100 is configured with a photoelectric conversion element 101 and a pixel signal processing portion 102. The photoelectric conversion element 101 converts light into an electrical signal and the pixel signal processing portion 102 then outputs the converted electrical signal to the column circuit 105.

The vertical scanning circuit portion 103 receives a control pulse signal supplied from the control pulse generation portion 109 and then supplies a control pulse signal to each pixel 100. A logic circuit, such as a shift register or an address decoder, is used as the vertical scanning circuit portion 103.

Each signal line 107 is used to supply a signal output from the pixel 100 selected by the vertical scanning circuit portion 103 to a circuit located subsequent to the pixel 100 as an electric potential signal.

The column circuit 105 receives signals from the respective pixels 100 via the signal line 107 and performs predetermined processing on the received signals. The predetermined processing includes processing for performing noise removal and amplification on the signals and converting the signals into a format to be output to the outside of the photodetection device 10. The column circuit 105 includes, for example, a parallel-serial conversion circuit.

The horizontal scanning circuit portion 104 supplies, to the column circuit 105, control pulse signals for sequentially outputting the signals processed by the column circuit 105 to an output circuit 108.

The output circuit 108 is configured with, for example, a buffer amplifier and a differential amplifier, and outputs the signals output from the column circuit 105 to a recording unit or a signal processing unit located outside the photodetection device 10.

Referring to FIG. 1, the arrangement of pixels 100 in the pixel portion 106 can be a one-dimensional arrangement or can be configured with only one pixel. Furthermore, the pixel portion 106 can be divided into blocks each including a plurality of pixel rows, and the vertical scanning circuit portion 103, the horizontal scanning circuit portion 104, and the column circuit 105 can be arranged for each block. Moreover, those can be arranged for each pixel row.

The function of the pixel signal processing portion 102 does not necessarily need to be provided for each of all of the pixels, and, for example, one pixel signal processing portion 102 can be shared by a plurality of pixels 100 so that signal processing is sequentially performed. Furthermore, to increase the aperture ratio of the photoelectric conversion element 101, the pixel signal processing portion 102 can be provided at a semiconductor substrate different from the photoelectric conversion element 101. In this case, the photoelectric conversion element 101 and the pixel signal processing portion 102 are interconnected via a connecting wire provided for each pixel. The vertical scanning circuit portion 103, the horizontal scanning circuit portion 104, the signal lines 107, and the column circuit 105 can also be provided at different semiconductor substrates as mentioned above.

Figure 2:
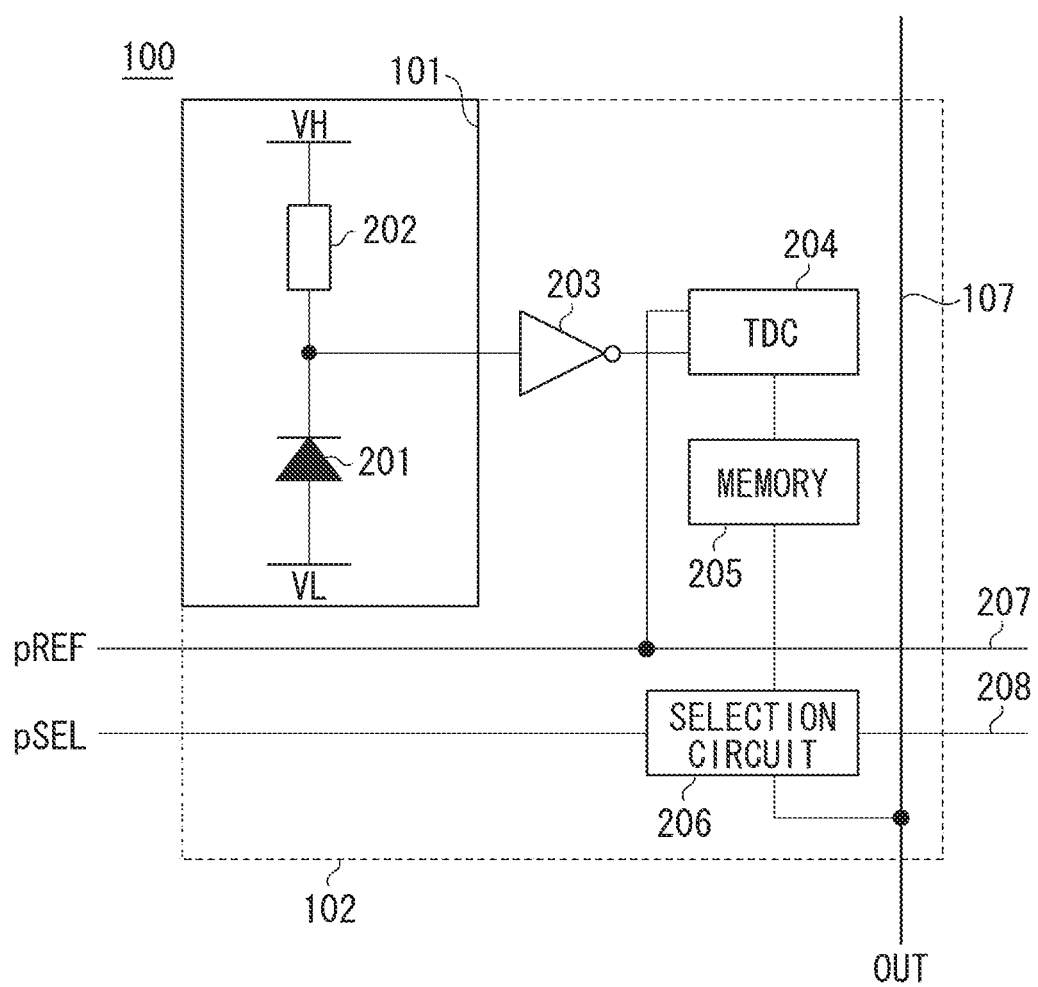
FIG. 2 is a block diagram of a pixel including an equivalent circuit.

FIG. 2 illustrates an example of a block diagram of the pixel 100 including an equivalent circuit according to the present exemplary embodiment. Referring to FIG. 2, each pixel 100 includes a photoelectric conversion element 101 and a pixel signal processing portion 102.

The photoelectric conversion element 101 includes a photoelectric conversion portion 201 and a control portion 202.

The photoelectric conversion portion 201 generates an electric charge pair which corresponds to incident light by photoelectric conversion. For example, a photodiode is used as the photoelectric conversion portion 201.

An electric potential which is based on an electric potential VH higher than an electric potential VL supplied to the anode of the photoelectric conversion portion 201 is supplied to the cathode of the photoelectric conversion portion 201. Then, the electric potentials are supplied to the anode and cathode of the photoelectric conversion portion 201 in such a manner that a reverse bias is applied in such a way as to cause the photoelectric conversion portion 201 to serve as an avalanche diode. Performing photoelectric conversion with such reverse-bias electric potentials supplied causes electric charges generated by incident light to bring about avalanche amplification, so that an avalanche current is generated.

Furthermore, in a case where reverse-bias electric potentials are supplied, when an electric potential difference between the anode and the cathode is higher than a breakdown voltage, the avalanche diode performs a Geiger-mode operation. A photodiode which fast detects a weak signal in the level of a single photon using the Geiger-mode operation is an SPAD.

Moreover, in a case where the electric potential difference between the anode and the cathode of the photoelectric conversion portion 201 is equal to or greater than an electric potential difference according to which an electric charge generated in the photoelectric conversion portion 201 brings about avalanche amplification and is equal to or lower than the breakdown voltage, the avalanche diode enters a linear mode. An avalanche diode which performs photodetection in the linear mode is referred to as an "avalanche photodiode (APD)". In the present exemplary embodiment, the photoelectric conversion portion 201 can operate as any one of the above two avalanche diodes. Additionally, the electric potential difference according to which avalanche amplification is brought about is described below.

The control portion 202 is connected to a power-supply voltage which supplies the high electric potential VH and to the photoelectric conversion portion 201. The control portion 202 has the function to transform a change in an avalanche current generated in the photoelectric conversion portion 201 into a voltage signal. Moreover, the control portion 202 functions as a load circuit (a quenching circuit) at the time of signal amplification caused by avalanche amplification, and has the action of restricting a voltage to be supplied to the photoelectric conversion portion 201 and restricting avalanche amplification (a quenching operation). The control portion 202 is configured with, for example, a resistive element, or an active quenching circuit which actively restricts avalanche multiplication by detecting an increase in avalanche current and performing feedback control.

The pixel signal processing portion 102 includes a waveform shaping portion 203, a time to digital converter (TDC) 204, a memory 205, and a selection circuit 206.

The waveform shaping portion 203 outputs a pulse signal by shaping a change in voltage obtained at the time of detecting a single-photon-level signal. For example, an inverter circuit is used as the waveform shaping portion 203. Furthermore, while an example in which a single inverter is used as the waveform shaping portion 203 is illustrated, a circuit configured with a plurality of inverters connected in series can be used or another circuit having the effect of waveform shaping can be used.

The timing of generation of the pulse signal output from the waveform shaping portion 203 is converted into a digital signal by the TDC 204.

A control pulse signal pREF (reference signal) is supplied from the vertical scanning circuit portion 103 illustrated in FIG. 1 to the TDC 204 via a drive line 207 to measure the timing of the pulse signal. The TDC 204 acquires, as a digital signal, a signal obtained by converting the input timing of a signal output from each pixel via the waveform shaping portion 203 into a relative time based on the control pulse signal pREF.

The circuit of the TDC 204 is configured with the use of, for example, a delay line method in which buffer circuits are connected in series to produce delay, or a looped TDC method in which delay lines are connected in a loop form. While another method can be used, a circuit method capable of attaining a time resolution equal to or greater than the time resolution of the photoelectric conversion portion 201 is desirable.

The digital signal indicating the pulse detection timing acquired by the TDC 204 is stored in one or a plurality of memories 205.

A control pulse signal pSEL is supplied from the vertical scanning circuit portion 103 illustrated in FIG. 1 to the selection circuit 206 via a drive line 208 to switch electrical connection and disconnection between the memory 205 and the signal line 107. For example, a transistor or a buffer circuit for outputting a signal to the outside of the pixel is used as the selection circuit 206.

In a case where a plurality of memories 205 is arranged, if a plurality of signals is supplied to the selection circuit 206, when digital signals held in the memories 205 are output to the signal line 107, outputting to the signal line 107 can be controlled on a memory-by-memory basis.

Furthermore, a switch such as a transistor can be arranged between the control portion 202 and the photoelectric conversion portion 201 or between the photoelectric conversion element 101 and the pixel signal processing portion 102 to switch electrical connection. Similarly, supplying of the high electric potential VH, which is supplied to the control portion 202, or the low electric potential VL, which is supplied to the photoelectric conversion portion 201, can be electrically switched by using a switch such as a transistor.

Figure 3:
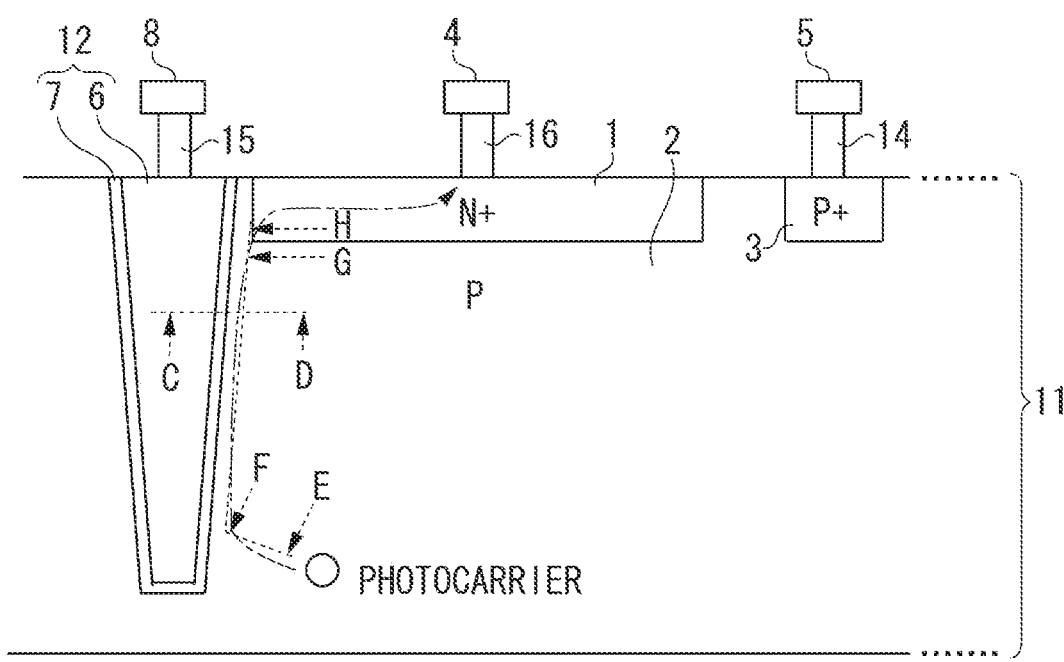
FIG. 3 is a cross-sectional schematic view of the photodetection device according to the first exemplary embodiment.

FIG. 3 is a cross-sectional schematic view of the photodetection device 10 according to the present exemplary embodiment. In the present exemplary embodiment, the polarity of an electric charge used as a signal electric charge in an electric charge pair generated in the photoelectric conversion portion 201 is referred to as a "first conductivity type". Moreover, a conductivity type opposite to the first conductivity type is referred to as a "second conductivity type". In the description of the present exemplary embodiment, for example, an electric charge of the first conductivity type is an electron, and an electric charge of the second conductivity type, which is opposite to the first conductivity type, is a hole. However, an electric charge of the second conductivity type can be an electron, and an electric charge of the first conductivity type can be a hole.

A semiconductor substrate 11 has a first surface and a second surface which are opposite to each other. For example, the first surface is the obverse side of the semiconductor substrate 11, and the second surface is the reverse side of the semiconductor substrate 11. Furthermore, in the description of the present exemplary embodiment, the depth direction extends from the first surface to the second surface.

An N-type semiconductor region 1 (a first semiconductor region) in which a signal electric charge is a majority carrier is located at the first surface side of the semiconductor substrate 11. A P-type semiconductor region 2 (a second semiconductor region) is located at a position deeper than the N-type semiconductor region 1 with respect to the first surface of the semiconductor substrate 11. The N-type semiconductor region 1 and the P-type semiconductor region 2 constitute a PN junction, thus configuring the photoelectric conversion portion 201. An electric potential which serves as a reverse bias with respect to an electric potential to be supplied to the P-type semiconductor region 2 is supplied to the N-type semiconductor region 1. Supplying a reverse bias to the photoelectric conversion portion 201 in this way causes an electric field to occur between the N-type semiconductor region 1 and the P-type semiconductor region 2 in the PN junction.

In the present exemplary embodiment, an electric potential difference between the N-type semiconductor region 1 and the P-type semiconductor region 2 is set in such a manner that an electric field occurring between the N-type semiconductor region 1 and the P-type semiconductor region 2, which constitute the PN junction, becomes sufficiently large. The term "sufficiently large" as used herein means the largeness according to which electrons affected by the electric field brings about avalanche amplification. In other words, an electric potential difference between the N-type semiconductor region 1 and the P-type semiconductor region 2 is set in such a manner that the photoelectric conversion portion 201 achieves an operation serving as an avalanche diode (APD or SPAD).

The impurity concentration of the N-type semiconductor region 1 is set to an impurity concentration according to which every areas of the N-type semiconductor region 1 are not depleted when an electric potential difference bringing about avalanche amplification is supplied to the PN junction.

More specifically, the impurity concentration of the N-type semiconductor region 1 is $6.0 \times 10^{18}$ [atms/cm$^3$] or more, and the impurity concentration of the P-type semiconductor region 2 is $5.0 \times 10^{16}$ [atms/cm$^3$] or more. This is because, if a depletion layer region spreads to such an extent as to contact the first surface of the semiconductor substrate 11, a noise might occur at the first surface of the semiconductor substrate 11. However, these impurity concentrations are not limiting.

Furthermore, the above-mentioned electric potential difference between the N-type semiconductor region 1 and the P-type semiconductor region 2 which is set in such a manner that the photoelectric conversion portion 201 achieves an operation serving as an avalanche diode (APD or SPAD) is, in particular, 6 V or higher.

In consideration of the above-mentioned impurity concentration relationship, it is more desirable that the electric potential difference between the N-type semiconductor region 1 and the P-type semiconductor region 2 be 10 V or higher and the electric potential difference between the N-type semiconductor region 1 and the P-type semiconductor region 2 be 30 V or lower. At this time, for example, an electric potential equal to or higher than 10 V and equal to or lower than 30 V is supplied to the N-type semiconductor region 1, and an electric potential equal to or higher than −10 V and equal to or lower than 0 V is supplied to the P-type semiconductor region 2. However, as long as the electric potential difference is 6 V or higher, these electric potentials are not limiting.

In FIG. 3, the P-type semiconductor region 2 is, for example, a region having an even impurity concentration. However, the P-type semiconductor region 2 can have a gradient of impurity concentration in such a way as to have a potential structure in which electric charges move to the first surface side of the semiconductor substrate 11.

For example, the P-type semiconductor region 2 can have a gradient of impurity concentration in which the impurity concentration becomes lower from a deep position toward a shallow position with respect to the first surface. At this time, for example, the P-type semiconductor region 2 has a first region, a second region located at a position deeper than the first region with respect to the first surface, and a third area located at a position deeper than the first region and the second region with respect to the first surface. Then, when the first region has a first impurity concentration, the second region has a second impurity concentration lower than the first impurity concentration. Then, the third area has a third impurity concentration higher than the first impurity concentration and the second impurity concentration. However, the third area can have a third impurity concentration lower than the first impurity concentration and higher than the second impurity concentration.

According to such a configuration, the P-type semiconductor region 2 has a gradient of impurity concentration in such a way as to have a potential structure in which electric charges move to the first surface side of the semiconductor substrate 11. Furthermore, the third area enables restricting leakage electric charges which may be generated at pixels when a plurality of pixels is arranged on the same semiconductor substrate 11. Moreover, the impurity concentration of the P-type semiconductor region 2 in the PN junction is higher than the impurity concentration of an area deeper than the PN junction with respect to the first surface of the semiconductor substrate 11. This enables increasing the intensity of an electric field occurring in the joined portion of the PN junction by narrowing the width of a depletion layer in the PN junction.

Furthermore, a P-type semiconductor region is discouraged from being located at a position which is shallower than the N-type semiconductor region 1 with respect to the first surface and which overlaps the N-type semiconductor region 1 in planar view. This configuration enables preventing unwanted electric charges generated at the surface of the semiconductor substrate 11 from being subjected to avalanche amplification.

A P-type semiconductor region 3 (a fourth semiconductor region) is electrically connected to the P-type semiconductor region 2. The impurity concentration of the P-type semiconductor region 3 is higher than the impurity concentration of the P-type semiconductor region 2. With this, connecting the P-type semiconductor region 3 and a contact plug 14 is able to make contact resistance lower than connecting the P-type semiconductor region 2 and the contact plug 14. However, the contact plug 14 can be located at the P-type semiconductor region 2 without involving the P-type semiconductor region 3.

It is desirable that the P-type semiconductor region 2 be located between a dielectric member 7 and the P-type semiconductor region 3. This is because, if the P-type semiconductor region 3 and the dielectric member 7 are in contact with each other, electric field concentration occurs between the P-type semiconductor region 3 and an electrode 6.

A buried portion 12 is formed with the electrode 6 and the dielectric member 7, which are buried in the semiconductor substrate 11. The buried portion 12 is located to extend from the first surface of the semiconductor substrate 11 to a position deeper than the position in which the N-type semiconductor region 1 is located. At this time, the buried portion 12 is formed in a position deeper than a depletion layer region formed by the PN junction between the N-type semiconductor region 1 and the P-type semiconductor region 2.

The dielectric member 7 is located between the electrode 6 and the semiconductor substrate 11. Furthermore, a first portion of the dielectric member 7 is in contact with the N-type semiconductor region 1, and a second portion of the dielectric member 7 is in contact with the P-type semiconductor region 2. The buried portion 12 is configured with, for example, a trench structure (deep trench isolation (DTI)).

The material used for the electrode 6 is, for example, N-type or P-type doped polysilicon or a metal material. The material used for the dielectric member 7 is, for example, a silicon dioxide film, a silicon nitride film, or a dielectric film including fixed charges. Examples of the dielectric film including fixed charges include hafnium dioxide ($HfO_2$), zirconium dioxide ($ZrO_2$), aluminum oxide ($Al_2O_3$), titanium oxide ($TiO_2$), and tantalum oxide (($Ta_2O_5$).

A case is described in which an electric potential difference between the electrode 6 and the P-type semiconductor region 2 when a material including fixed charges is used for the dielectric member 7 is the same as an electric potential difference between the electrode 6 and the P-type semiconductor region 2 when a material including no fixed charges is used for the dielectric member 7. At this time, if a material including fixed charges is used, the intensity of an electric field occurring between the electrode 6 and the P-type semiconductor region 2 can be more increased. In other words, in a case where the intensity of the electric field between the electrode 6 and the P-type semiconductor region 2 is set to a predetermined value, if a material including fixed charges is used for the dielectric member 7, the electric potential difference between the electrode 6 and the P-type semiconductor region 2 can be decreased. Thus, a low-voltage configuration can be attained.

Furthermore, in a case where a material capable of absorbing or reflecting near-infrared light or visible light is used as the material of the electrode 6, light generated at the time of occurrence of avalanche amplification can be prevented from entering the surrounding pixels.

An electric potential higher than that for the P-type semiconductor region 2 is supplied to the electrode 6. With this, an electric field occurs between the electrode 6 and the P-type semiconductor region 2. A region which is affected by an electric field between the electrode 6 and the P-type semiconductor region 2 and which is in contact with the dielectric member 7 on a side surface of the electrode 6 is hereinafter referred to as a "semiconductor region in the vicinity of the side surface of the buried portion 12".

Furthermore, when a signal electric charge is a hole, since a region corresponding to the P-type semiconductor region 2 is an N-type semiconductor region, an electric potential lower than that for the N-type semiconductor region corresponding to the P-type semiconductor region 2 is supplied to the electrode 6.

According to this electric field, photocarriers (electrons) generated at a deep portion of the semiconductor substrate 11 move to the semiconductor region in the vicinity of the side surface of the buried portion 12, as indicated by a dashed-dotted line arrow illustrated in FIG. 3. The detailed reason is described below with reference to FIGS. 4A, 4B, and 4C. Furthermore, the deep portion of the semiconductor substrate 11 refers to, for example, an area located in a position deeper than the PN junction in the P-type semiconductor region 2 located under the N-type semiconductor region 1 (for example, the above-mentioned second region).

Furthermore, electrons having moved to the semiconductor region in the vicinity of the side surface of the buried portion 12 move to the N-type semiconductor region 1. Alternatively, the electrons bring about avalanche amplification at the semiconductor region in the vicinity of the side surface of the buried portion 12. The reason is described below with reference to FIG. 5.

The contact plug 14 is connected to the P-type semiconductor region 3. A contact plug 15 is connected to the electrode 6. A contact plug 16 is connected to the N-type semiconductor region 1. Then, a wiring portion 5 supplies an electric potential to the P-type semiconductor region 3 via the contact plug 14. A wiring portion 8 supplies an electric potential to the electrode 6 via the contact plug 15. A wiring portion 4 supplies an electric potential to the N-type semiconductor region 1 via the contact plug 16. The wiring portion 4 is connected to the control portion 202 illustrated in FIG. 2. Here, the wiring portion 4 electrically connected to the N-type semiconductor region 1 and the wiring portion 8 electrically connected to the electrode 6 are different wiring portions, but can be configured as the same wiring portion so as to reduce the number of wiring lines.

Furthermore, while, here, the contact plug 16 is configured to be directly connected to the N-type semiconductor region 1, an additional N-type semiconductor region electrically connected to the N-type semiconductor region 1 can be provided and the contact plug 16 can be formed at the additional N-type semiconductor region.

Figure 4A:
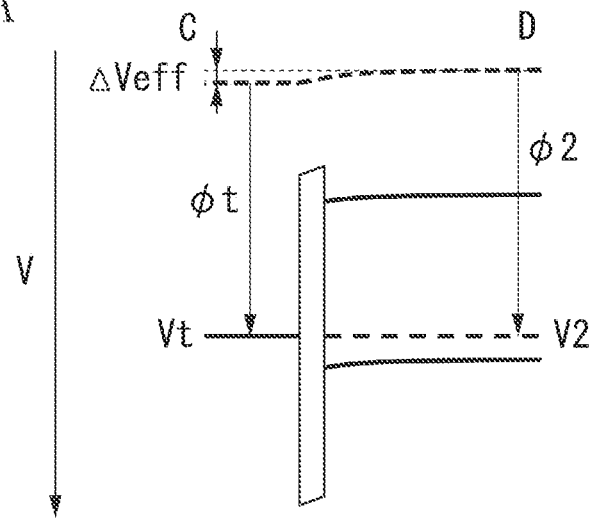
FIGS. 4A, 4B, and 4C are energy band diagrams in a line segment CD.
Figure 4B:
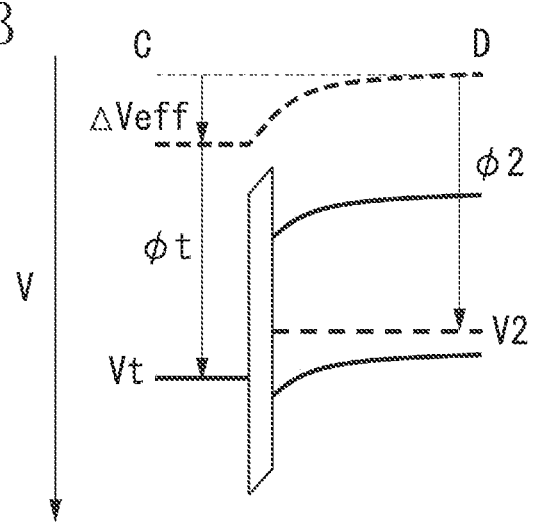
Figure 4C:
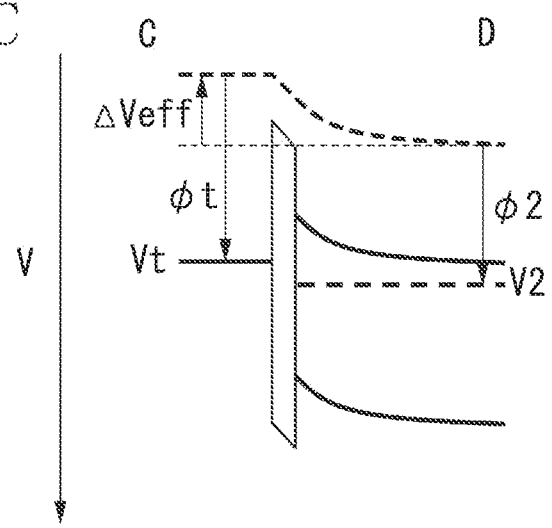

FIGS. 4A to 4C illustrate an energy band structure of the electrode 6, the dielectric member 7, and the P-type semiconductor region 2. The reason why electrons generated at the deep portion of the semiconductor substrate 11 are drawn to the semiconductor region in the vicinity of the side surface of the buried portion 12 is described with reference to FIGS. 4A to 4C.

FIGS. 4A to 4C illustrate examples of the energy band diagrams of a region taken along a line segment CD illustrated in FIG. 3. FIGS. 4A and 4B are energy band diagrams in a case where a signal electric charge is an electron (electron amplification type), and FIG. 4C is an energy band diagram in a case where a signal electric charge is a hole (hole amplification type). In FIGS. 4A to 4C, the downward direction in the illustration is supposed to be a positive direction of an electric potential V. Furthermore, in a case where a signal electric charge has a reverse polarity, an inequality sign in a mathematical expression or inequality is inverted.

Furthermore, electric potential Vt indicates an electric potential supplied to the electrode 6, and work function $\phi t$ indicates a work function of the electrode 6. Electric potential V2 indicates an electric potential supplied to the P-type semiconductor region 2, and work function $\phi 2$ indicates a work function of the P-type semiconductor region 2. Moreover, difference $\Delta \text{Veff}=(\phi 2-\phi t)$ indicates a difference in vacuum level when the electrode 6 and the P-type semiconductor region 2 are in contact with each other.

FIG. 4A is an energy band diagram when the electric potential Vt and the electric potential V2 are set to the same electric potential. A condition under which electrons are drawn to the semiconductor region in the vicinity of the side surface of the buried portion 12 is that the difference $\Delta \text{Veff}=(\phi 2-\phi t)$ between the vacuum level of the electrode 6 and the vacuum level of the P-type semiconductor region 2 becomes a positive value. Since the P-type semiconductor region 2 and the electrode 6 have a difference in the respective work functions, a difference occurs in vacuum level. The condition for the difference in vacuum level under which electrons are drawn to the semiconductor region in the vicinity of the side surface of the buried portion 12 becomes mathematical inequality (1).

$$(\phi 2-\phi t) \geq 0 \quad (1)$$

According to mathematical inequality (1), electrons generated at the semiconductor region in the vicinity of the side surface of the buried portion 12 are drawn to the semiconductor region in the vicinity of the side surface of the buried portion 12. However, to draw electrons generated at the deep portion of the semiconductor substrate 11 to the semiconductor region in the vicinity of the side surface of the buried portion 12, it is desirable that the electric potential of the electrode 6 be set higher than the electric potential of the P-type semiconductor region 2.

Next, FIG. 4B illustrates a configuration in which the electric potential of the electrode 6 is set higher than the electric potential of the P-type semiconductor region 2. In FIG. 4B, a condition under which electrons generated at the deep portion of the semiconductor substrate 11 are drawn to the semiconductor region in the vicinity of the side surface of the buried portion 12 is mathematical inequality (2). Furthermore, mathematical expression (3) is an inequality obtained by transforming mathematical inequality (2).

$$(Vt-\phi t)-(V2-\phi 2) \geq 0 \quad (2)$$

$$(V2-\phi 2) \leq (Vt-\phi t) \quad (3)$$

Electrons are more likely to move to the semiconductor region in the vicinity of the side surface of the buried portion 12 in a case where the conditions of mathematical inequality (1) and mathematical inequality (3) are satisfied than in a case where only mathematical inequality (1) is satisfied. This is because electric charges generated in a region distant from the semiconductor region in the vicinity of the side surface of the buried portion 12 are also drawn by an electric field occurring between the electrode 6 and the P-type semiconductor region 2. However, if the electric potential of the electrode 6 is set equal to or higher than the electric potential of the P-type semiconductor region 2, such an effect is produced that electrons are drawn to the semiconductor region in the vicinity of the side surface of the buried portion 12.

Next, a description is made about a case where a signal electric charge is a hole. In a case where a signal electric charge is a hole, a region corresponding to the P-type semiconductor region 2 is an N-type semiconductor region. Therefore, an energy band diagram of a region taken along the line segment CD illustrated in FIG. 3 is FIG. 4C. In FIG. 4C, to allow holes generated at the deep portion of the semiconductor substrate 11 to be drawn to the semiconductor region in the vicinity of the side surface of the buried portion 12, the electric potential to be supplied to the electrode 6 is set to an electric potential lower than the electric potential to be supplied to the N-type semiconductor region corresponding to the P-type semiconductor region 2. However, if the electric potential of the electrode 6 is set equal to or lower than the electric potential of the N-type semiconductor region corresponding to the P-type semiconductor region 2, such an effect is produced that holes are drawn to the semiconductor region in the vicinity of the side surface of the buried portion 12.

FIG. 5 illustrates a potential structure used to describe movement paths of signal electric charges generated at the deep portion of the semiconductor substrate 11. FIG. 5 is an example of a potential structure diagram in a line segment EH illustrated in the cross-sectional schematic view of FIG. 3. Here, a potential as viewed from an electron serving as a signal electric charge is illustrated. Furthermore, in a case where a signal electric charge is a hole, the direction of the potential is inverted. FIG. 5 is described on the assumption that the above condition of mathematical inequality (3) is satisfied. In the description of FIG. 5, the electric potential V1 indicates an electric potential supplied to the N-type semiconductor region 1, and the work function φ1 indicates a work function of the N-type semiconductor region 1.

FIG. 5 illustrates an example of a potential structure in the line segment EH. In FIG. 5, a dotted line 17 is a potential structure in the line segment EH in a case where the condition of mathematical inequality (4) is satisfied, and a solid line 18 is a potential structure in the line segment EH in a case where the condition of mathematical inequality (5) is satisfied.

$$(V2-\phi 2) \leq (Vt-\phi t) < (V1-\phi 1) \quad (4)$$

$$(V2-\phi 2) < (V1-\phi 1) \leq (Vt-\phi t) \quad (5)$$

Furthermore, referring to FIG. 5, the definitions of the positions (E, F, G, and H) and the definitions of heights of the potentials (XH level, H level, L level, and XL level) are described as follows.

The position E is a position which belongs to the P-type semiconductor region 2 and is also an optional position distant from the side surface of the electrode 6. The position F is the position of the semiconductor region in the vicinity of the side surface of the buried portion 12. The position G is a position in the vicinity of the PN junction region between the P-type semiconductor region 2 and the N-type semiconductor region 1. The position H is a position which belongs to the N-type semiconductor region 1.

The height of the potential of the XH level indicates the height of the potential of the P-type semiconductor region 2. The height of the potential of the H level indicates the height of the potential of the semiconductor region in the vicinity of the side surface of the buried portion 12 in a case where the condition of mathematical inequality (4) is satisfied. The height of the potential of the L level indicates the height of the potential of the semiconductor region in the vicinity of the side surface of the buried portion 12 in a case where the condition of mathematical inequality (5) is satisfied or the height of the potential in the vicinity of the PN junction region in a case where the condition of mathematical inequality (4) is satisfied. The height of the potential of the XL level indicates the height of the potential of the N-type semiconductor region 1.

In the dotted line 17, the height of the potential of about the XH level continues in an interval from the position E to a position in front of the position F. As the position comes closer to the position F, the height of the potential gradually decreases from the XH level and reaches the height of the potential of the H level. In an interval from the position F to a position in front of the position G, the height of the potential of about the H level continues. As the position comes closer to the position G, the height of the potential steeply decreases from the H level and reaches the height of the potential of the L level. In an interval from the position G to the position H, the height of the potential decreases from the L level to the XL level.

When the condition of mathematical inequality (4) is satisfied as indicated by the dotted line 17, electrons generated at the P-type semiconductor region 2 distant from the semiconductor region in the vicinity of the side surface of the buried portion 12 are drawn to the semiconductor region in the vicinity of the side surface of the buried portion 12 by an electric field.

The semiconductor region in the vicinity of the side surface of the buried portion 12 is configured with the P-type semiconductor region 2. Therefore, in a case where the P-type semiconductor region 2 has a gradient of impurity concentration, electric charges having moved to the semiconductor region in the vicinity of the side surface of the buried portion 12 move through the semiconductor region in the vicinity of the side surface of the buried portion 12 toward the N-type semiconductor region 1. When the electrons come close to the N-type semiconductor region 1, the electrons receive an electric field more intense than the electric field in the position F and thus bring about avalanche amplification.

Furthermore, referring to FIG. 5, the height of the potential at the position F becomes lower than the height of the potential at the position E. This indicates that the height of the potential becomes lower due to an electric field at the semiconductor region in the vicinity of the side surface of the buried portion 12 than at the P-type semiconductor region 2 distant from the semiconductor region in the vicinity of the side surface of the buried portion 12.

Similarly, the height of the potential at the position G becomes lower than the height of the potential at the position F. This indicates that, in the semiconductor region in the vicinity of the side surface of the buried portion 12, the height of the potential becomes gradually lower at the shallow portion of the semiconductor substrate 11 than at the deep portion thereof. In other words, this indicates that the P-type semiconductor region 2 has a gradient of impurity concentration.

Next, in the solid line 18, in an interval from the position E to a position in front of the position F, the height of the potential decreases from the XH level to the H level. As the position comes closer to the position F, the height of the potential steeply decreases from the H level and reaches the height of the potential of the L level. When the position passes the position F, the height of the potential decreases from the L level to the XL level. Then, at the positions G and H, the height of the potential of the XL level continues.

When the condition of mathematical inequality (5) is satisfied as indicated by the solid line 18, an inversion layer is formed at the P-type semiconductor region 2 located in the semiconductor region in the vicinity of the side surface of the buried portion 12. The inversion layer formed at this time is electrically connected to the N-type semiconductor region 1. In particular, in a case where the electric potential Vt to be supplied to the electrode 6 is sufficiently large and the inversion layer is in an intense inversion condition due to a large electric potential difference from the P-type semiconductor region 2, highly-concentrated electrons gather at the inversion layer. Therefore, in the case of the solid line 18, the P-type semiconductor region 2 does not need to have a gradient of impurity concentration.

As mentioned above, the N-type semiconductor region 1 and a part of the dielectric member 7 are in contact with each other. Therefore, the inversion layer and the N-type semiconductor region 1 are electrically connected to each other and have the same electric potential, and the height of the potential of the inversion layer formed at the semiconductor region in the vicinity of the side surface of the buried portion 12 becomes equal to the height of the potential of the N-type semiconductor region 1.

In the solid line 18, electrons generated at the deep position with respect to the first surface of the semiconductor substrate 11 are drawn from the P-type semiconductor region 2 (position E) distant from the semiconductor region in the vicinity of the side surface of the buried portion 12 to the semiconductor region (position F) in the vicinity of the side surface of the buried portion 12. This is caused by an electric field weaker than the electric field occurring between the buried portion 12 and the P-type semiconductor region 2. When the electric charges come close to the semiconductor region (position F) in the vicinity of the side surface of the buried portion 12, the electric charges receive an electric field more intense than the electric field in the position E and thus bring about avalanche amplification.

In other words, avalanche amplification is caused at the inversion layer by an intense electric field occurring between the inversion layer and the P-type semiconductor region 2. An avalanche current generated at this time flows in the N-type semiconductor region 1 via the inversion layer. Then, the current is output as a signal via the wiring portion 4 connected to the control portion 202 illustrated in FIG. 2.

As mentioned above, when mathematical inequality (5) is satisfied, an intense electric field which causes avalanche amplification is not only an intense electric field of the PN junction in the vicinity of the first surface of the semiconductor substrate 11 but also an intense electric field occurring between the inversion layer, which is generated at the semiconductor region in the vicinity of the side surface of the buried portion 12 and is in contact with the dielectric member 7, and the P-type semiconductor region 2.

According to a bias condition as indicated by the dotted line 17, the length of time required for electric charges generated at the deep portion of the semiconductor substrate 11 to move to the PN junction occurring in the vicinity of the first surface of the semiconductor substrate 11 can be decreased, so that the length of time required for detection of electric charges can be decreased.

Furthermore, according to a bias condition as indicated by the solid line 18, the inversion layer induced at the semiconductor region in the vicinity of the side surface of the buried portion 12 is electrically connected to the N-type semiconductor region 1. Therefore, the inversion layer and the N-type semiconductor region 1 have the same electric potential. Then, electric charges generated at the deep portion of the semiconductor substrate can bring about avalanche amplification at the semiconductor region in the vicinity of the side surface of the buried portion 12 without moving to the PN junction located in the vicinity of the first surface of the semiconductor substrate 11. Therefore, the length of time required for detection of electric charges can be more decreased than that indicated by the dotted line 17.

Moreover, in the case of the solid line 18, since an intense electric field occurs between the inversion layer and the P-type semiconductor region 2, an effective electric potential applied to the dielectric member 7 located between the electrode 6 and the P-type semiconductor region 2 becomes about "$(V_t-\phi t)-(V_1-\phi 1)$". Such a configuration enables generating an intense electric field while preventing dielectric breakdown of the dielectric member 7.

Furthermore, in a conventional configuration discussed in Japanese Patent Application Laid-Open No. 2014-225647, an N-type semiconductor region which constitutes a PN junction is not electrically connected to a dielectric member included in a buried portion. In that case, even if an electric field is applied between the P-type semiconductor region which constitutes a PN junction and the buried portion, electric charges generated at the deep portion of the semiconductor substrate cannot be efficiently drawn to a PN junction region in which avalanche amplification is brought about. Moreover, an intense electric field occurring at the PN junction region located at the first surface side of the semiconductor substrate weakens in electric field at the deep portion of the semiconductor substrate.

Therefore, since signal electric charges generated at the deep portion of the semiconductor substrate randomly move about the semiconductor substrate by not drift but diffusion, detection of electric charges may become time-consuming.

Next, a photodetection device using the conventional configuration discussed in Japanese Patent Application Laid-Open No. 2014-225647 and the photodetection device 10 according to the present exemplary embodiment are compared with each other with reference to a photodetection frequency distribution chart illustrated in FIG. 6. FIG. 6 illustrates a photoresponsivity performance indicating the detection amount of electric charges with respect to the length of time required for an electric charge generated at the semiconductor substrate 11 to be detected (performance with respect to temporal dispersion). The abscissa axis in FIG. 6 indicates a time from when the photoelectric conversion element 101 receives a photon until when the detection of a signal is completed. The ordinate axis indicates a statistical probability distribution of the detection amount of electric charges with respect to the time of signal electric charges in electric charge pairs generated when light is incident.

A dotted line 19 indicates a detection frequency distribution of signal electric charges by the photodetection device using the above-mentioned conventional structure. A solid line 20 indicates a detection frequency distribution of signal electric charges by the photodetection device 10 using the configuration according to the present exemplary embodiment. Furthermore, in FIG. 6, the breadth of a peak of mode value includes, for example, an error caused by the pixel signal processing portion 102, which reads the timing of signals.

The dotted line 19 peaks at time T1. After that, a portion in which a gentle gradient of frequency distribution is long continued appears in the direction in which the required time increases (at the right-hand side of the graph). This portion is generally called a "diffusion tail (DT)". The DT is attributable to an electric charge generated at the deep portion of the semiconductor substrate, which reaches the PN junction located in the vicinity of the first surface of the semiconductor substrate 11 over time, being detected with a large time lag with respect to an electric charge generated at the shallow portion of the semiconductor substrate.

The DT becomes particularly conspicuous at the time of detecting light of a wavelength band which causes an electric charge to be generated at the deep portion (infrared light in the case of a front surface irradiation type, and all wavelengths from short wavelengths to long wavelengths in the case of a back surface irradiation type). Furthermore, here, the front surface irradiation type allows light to fall on the first surface, and the back surface irradiation type allows light to fall on the second surface.

In this way, in the case of the dotted line 19, the detection of signal electric charges generated at the deep portion of the semiconductor substrate 11 may be time-consuming. Therefore, in a case where light of wavelengths in which the probability that an electric charge is generated at the deep portion of the semiconductor substrate is not negligible is received, a time lag from the reception of light until the completion of detection of a signal electric charge may sometimes become long, so that the time resolution of photodetection may decrease.

On the other hand, the frequency distribution indicated by the solid line 20 has a peak of mode value at time T0, which is the time preceding the time T1. Furthermore, the peak of mode value is a peak higher than that in the dotted line 19. Moreover, in the solid line 20, the extent of breadth of the DT is small.

This is because, since the speed of detection of electric charges in the semiconductor substrate 11 in the case of the solid line 20 is higher than in the case of the dotted line 19, a length of time required for electric charges to reach the PN junction region located in the vicinity of the surface layer in the case of the dotted line 19 can be decreased.

Therefore, electric charges which would be detected at or after time T1 in the case of the dotted line 19 can be detected at about time T0 in the case of the solid line 20, and the amount of electric charges which are detected at about time T0 also increases.

Furthermore, in the case of the solid line 20, the length of time required for detection of electric charges generated at the deep portion of the semiconductor substrate 11 can be reduced as compared with the case of the dotted line 19, so that the extent of breadth of the DT can be restricted.

As described above, using the photodetection device 10 according to the present exemplary embodiment enables reducing the length of time required for detection of electric charges generated at the deep portion of the semiconductor substrate 11 as compared with a conventional photodetection device. Then, the dispersion of the time required for detection of electric charges between electric charges generated at the first surface of the semiconductor substrate 11 and electric charges generated at the deep portion of the semiconductor substrate 11 can be restricted.

Furthermore, any one of the front surface irradiation type and the back surface irradiation type can be employed in the present exemplary embodiment. In the case of the front surface irradiation type, when infrared light is incident, the dispersion of the time required for detection of electric charges between electric charges generated at the first surface of the semiconductor substrate 11 and electric charges generated at the deep portion of the semiconductor substrate 11 is conspicuously restricted. In the case of the back surface irradiation type, when blue light is incident, the dispersion of the time required for detection of electric charges between electric charges generated at the first surface of the semiconductor substrate 11 and electric charges generated at the deep portion of the semiconductor substrate 11 is conspicuously restricted.

Figure 14:
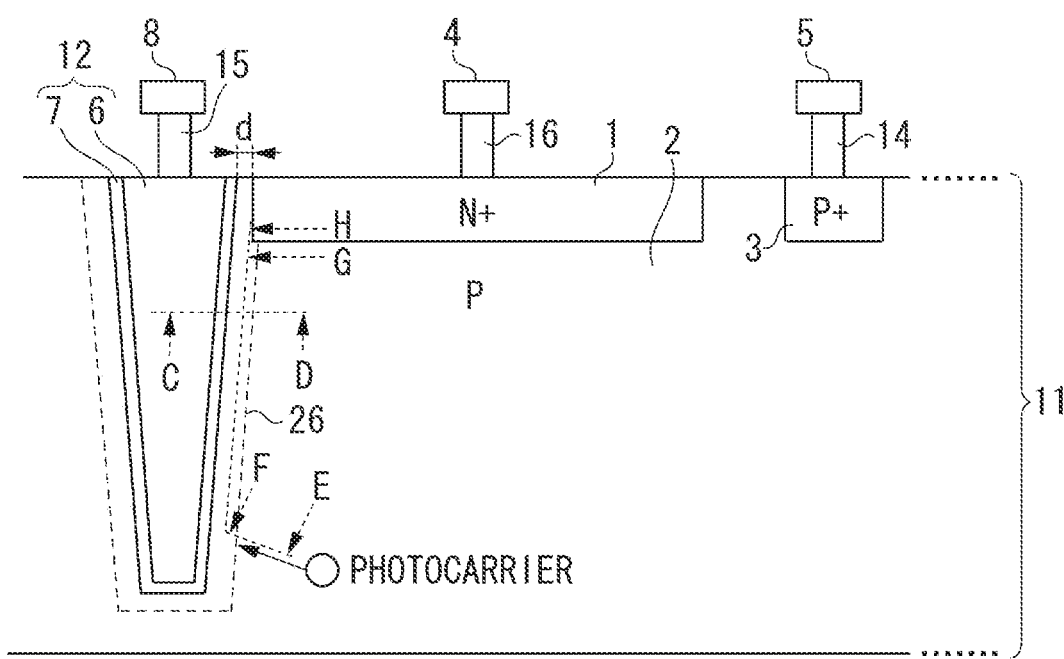
FIG. 14 is a cross-sectional schematic view of a photodetection device according to a second exemplary embodiment.

FIG. 14 is a cross-sectional schematic view of a photodetection device 10 according to a second exemplary embodiment. The same reference characters as those in FIG. 3 denote the respective same members. The particulars described in the first exemplary embodiment are also applied to the second exemplary embodiment. The second exemplary embodiment differs from the first exemplary embodiment in that the N-type semiconductor region 1 is not in contact with the buried portion 12.

The dielectric member 7 is located between the electrode 6 and the semiconductor substrate 11, and the dielectric member 7 is in contact with the P-type semiconductor region 2. The buried portion 12 is configured with, for example, a trench structure (deep trench isolation (DTI)). Furthermore, the distance d between the N-type semiconductor region 1 and the dielectric member 7 is 0.1 μm or less. The N-type semiconductor region 1 and the dielectric member 7 do not necessarily need to be separate from each other, but the N-type semiconductor region 1 and the dielectric member 7 can be in contact with each other.

An electric potential higher than that for the P-type semiconductor region 2 is supplied to the electrode 6. With this, an electric field occurs between the electrode 6 and the P-type semiconductor region 2. An inversion layer 26 is formed at a region which is affected by an electric field between the electrode 6 and the P-type semiconductor region 2 and which is in contact with the dielectric member 7 on a side surface of the electrode 6 (hereinafter referred to as a "semiconductor region in the vicinity of the side surface of the buried portion 12"). The condition under which the inversion layer 26 is formed is described below.

Furthermore, when a signal electric charge is a hole, since a region corresponding to the P-type semiconductor region 2 is an N-type semiconductor region, an electric potential lower than that for the N-type semiconductor region corresponding to the P-type semiconductor region 2 is supplied to the electrode 6.

According to this electric field, photocarriers (electrons) generated at a deep portion of the semiconductor substrate 11 move to the inversion layer 26, as indicated by a dotted line arrow illustrated in FIG. 14. The detailed reason is described below with reference to FIGS. 15A, 15B, and 15C. Furthermore, the deep portion of the semiconductor substrate 11 refers to, for example, an area located in a position deeper than the PN junction in the P-type semiconductor region 2 located under the N-type semiconductor region 1 (for example, the above-mentioned second region).

Furthermore, electrons having moved to the inversion layer 26 bring about avalanche amplification at the inversion layer 26. The reason is described below with reference to FIG. 16.

Figure 15A:
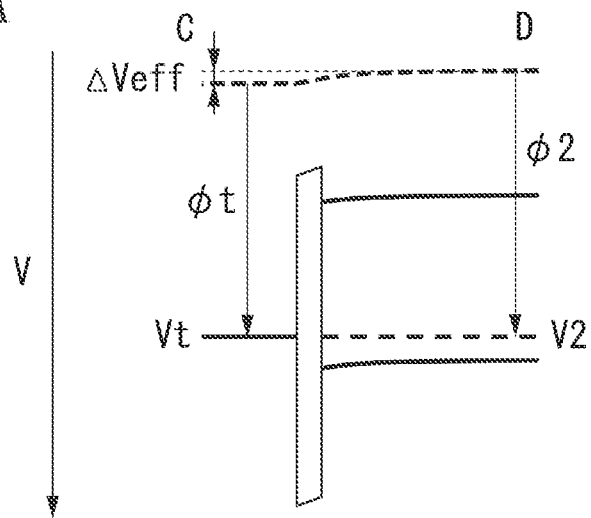
FIGS. 15A, 15B, and 15C are energy band diagrams in a line segment CD.
Figure 15B:
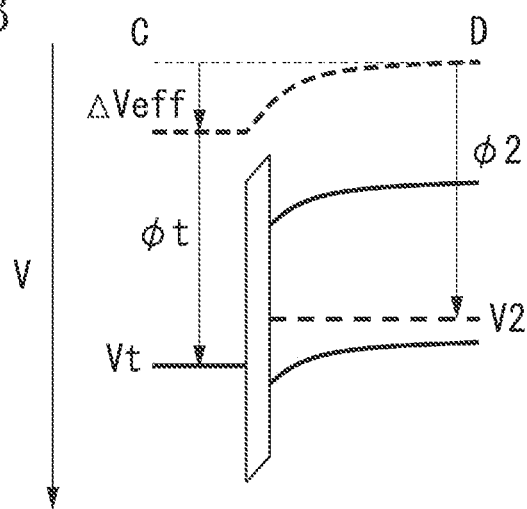
Figure 15C:
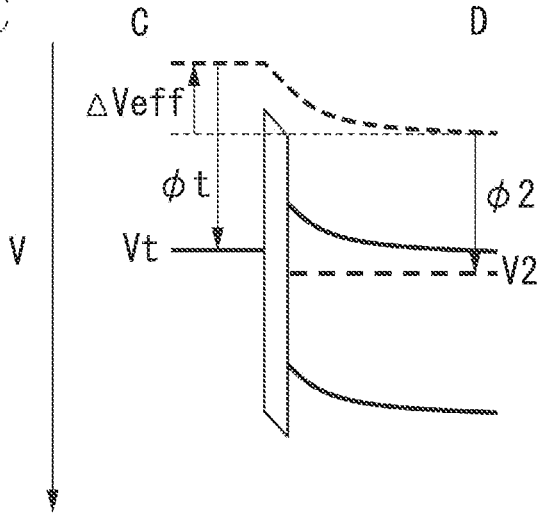

FIGS. 15A to 15C illustrate an energy band structure of the electrode 6, the dielectric member 7, and the P-type semiconductor region 2. The reason why electrons generated at the deep portion of the semiconductor substrate 11 are drawn to the inversion layer 26 is described with reference to FIGS. 15A to 15C.

FIGS. 15A to 15C illustrate examples of the energy band diagrams of a region taken along a line segment CD illustrated in FIG. 14. FIGS. 15A and 15B are energy band diagrams in a case where a signal electric charge is an electron (electron amplification type), and FIG. 15C is an energy band diagram in a case where a signal electric charge is a hole (hole amplification type). In FIGS. 15A to 15C, the downward direction in the illustration is supposed to be a positive direction of an electric potential V. Furthermore, in a case where a signal electric charge has a reverse polarity, an inequality sign in a mathematical inequality is inverted.

Furthermore, electric potential Vt indicates an electric potential supplied to the electrode 6, and work function $\phi t$ indicates a work function of the electrode 6. Electric potential V2 indicates an electric potential supplied to the P-type semiconductor region 2, and work function $\phi 2$ indicates a work function of the P-type semiconductor region 2. Moreover, difference $\Delta Veff=(\phi 2-\phi t)$ indicates a difference in vacuum level when the electrode 6 and the P-type semiconductor region 2 are in contact with each other.

FIG. 15A is an energy band diagram when the electric potential Vt and the electric potential V2 are set to the same electric potential. A condition under which electrons are drawn to the semiconductor region in the vicinity of the side surface of the buried portion 12 is that the difference $\Delta Veff$ between the vacuum level of the electrode 6 and the vacuum level of the P-type semiconductor region 2 becomes a positive value. Since the P-type semiconductor region 2 and the electrode 6 have a difference in the respective work functions, a difference occurs in vacuum level. The condition for the difference in vacuum level under which electrons are drawn to the semiconductor region in the vicinity of the side surface of the buried portion 12 becomes mathematical inequality (1).

$$(\phi 2-\phi t) \geq 0 \qquad (1)$$

According to mathematical inequality (1), electrons generated at the semiconductor region in the vicinity of the side surface of the buried portion 12 are drawn to the semiconductor region in the vicinity of the side surface of the buried portion 12. However, to draw electrons generated at the deep portion of the semiconductor substrate 11 to the semiconductor region in the vicinity of the side surface of the buried portion 12, it is desirable that the electric potential of the electrode 6 be set higher than the electric potential of the P-type semiconductor region 2.

Next, FIG. 15B illustrates a configuration in which the electric potential of the electrode 6 is set higher than the electric potential of the P-type semiconductor region 2. In FIG. 15B, a condition under which electrons generated at the deep portion of the semiconductor substrate 11 are drawn to the semiconductor region in the vicinity of the side surface of the buried portion 12 is mathematical inequality (2). Furthermore, mathematical inequality (3) is an inequality obtained by transforming mathematical inequality (2).

$$(Vt-\phi t)-(V2-\phi 2) \geq 0 \qquad (2)$$

$$(V2-\phi 2) \leq (Vt-\phi t) \qquad (3)$$

Electrons are more likely to move to the semiconductor region in the vicinity of the side surface of the buried portion 12 in a case where the conditions of mathematical inequality (1) and mathematical inequality (3) are satisfied than in a case where only mathematical inequality (1) is satisfied. This is because electrons generated in a region distant from the semiconductor region in the vicinity of the side surface of the buried portion 12 are also drawn by an electric field occurring between the electrode 6 and the P-type semiconductor region 2.

Next, a description is made about a case where a signal electric charge is a hole. In a case where a signal electric charge is a hole, a region corresponding to the P-type semiconductor region 2 is an N-type semiconductor region. Therefore, an energy band diagram of a region taken along the line segment CD illustrated in FIG. 14 is FIG. 15C. In FIG. 15C, to allow holes generated at the deep portion of the semiconductor substrate 11 to be drawn to the semiconductor region in the vicinity of the side surface of the buried portion 12, the electric potential to be supplied to the electrode 6 is set to an electric potential lower than the electric potential to be supplied to the N-type semiconductor region corresponding to the P-type semiconductor region 2.

FIG. 16 illustrates a potential structure used to describe movement paths of signal electric charges generated at the deep portion of the semiconductor substrate 11. FIG. 16 is an example of a potential structure diagram in a line segment EH illustrated in the cross-sectional schematic view of FIG. 14. Here, a potential as viewed from an electron serving as a signal electric charge is illustrated. Furthermore, in a case where a signal electric charge is a hole, the direction of the potential is inverted. FIG. 16 is described on the assumption that the above condition of mathematical inequality (3) is satisfied. In the description of FIG. 16, the electric potential V1 indicates an electric potential supplied to the N-type semiconductor region 1, and the work function $\phi 1$ indicates a work function of the N-type semiconductor region 1.

FIG. 16 illustrates an example of a potential structure in the line segment EH. In FIG. 16, a solid line 18 is a potential structure in the line segment EH in a case where the condition of mathematical inequality (5) is satisfied. At this time, the electric potential Vt of the electrode 6 is higher than the electric potential V1 of the N-type semiconductor region 1, and the electric potential Vt of the electrode 6 and the electric potential V1 of the N-type semiconductor region 1 each are higher than the electric potential V2 of the P-type semiconductor region 2. In other words, an electric potential difference between the electrode 6 and the P-type semiconductor region 2 is larger than an electric potential difference between the N-type semiconductor region 1 and the P-type semiconductor region 2. In this bias condition, the inversion layer 26 is formed at the semiconductor region in the vicinity of the side surface of the buried portion 12.

$$(V2-\phi 2)<(V1-\phi 1) \leq (Vt-\phi t) \qquad (5)$$

Furthermore, referring to FIG. 16, the definitions of the positions (E, F, G, and H) and the definitions of heights of the potentials (XH level, L level, and XL level) are described as follows.

The position E is a position which belongs to the P-type semiconductor region 2 and is also an optional position distant from the side surface of the electrode 6. The position F is a position at which the inversion layer 26 is formed. The position G is a position in the vicinity of the PN junction region between the P-type semiconductor region 2 and the N-type semiconductor region 1. The position H is a position which belongs to the N-type semiconductor region 1.

The height of the potential of the XH level indicates the height of the potential of the P-type semiconductor region 2. The height of the potential of the L level indicates the height of the potential of the inversion layer 26. The height of the potential of the XL level indicates the height of the potential of the N-type semiconductor region 1.

In the solid line 18, in an interval from the position E to a position in front of the position F, the height of the potential gradually decreases from the XH level. As the position comes closer to the position F, the height of the potential steeply decreases and reaches the height of the potential of the L level. When the position passes the position F, the height of the potential decreases from the L level to the XL level. Then, at the positions G and H, the height of the potential of the XL level continues.

When the condition of mathematical inequality (5) is satisfied as indicated by the solid line 18, the inversion layer 26 is formed at the P-type semiconductor region 2 located in the semiconductor region in the vicinity of the side surface of the buried portion 12. The inversion layer 26 formed at this time is electrically connected to the N-type semiconductor region 1. In particular, in a case where the electric potential Vt to be supplied to the electrode 6 is sufficiently large and the inversion layer 26 is in an intense inversion condition due to a large electric potential difference from the P-type semiconductor region 2, highly-concentrated electrons gather at the inversion layer 26.

As mentioned above, it is desirable that the distance d between the N-type semiconductor region 1 and the dielectric member 7 be set to 0.1 μm or less. Then, the electric potential which is supplied to the N-type semiconductor region 1 and the electric potential which is supplied to the electrode 6 are controlled in such a manner that the width of the inversion layer 26 becomes the distance d or more.

Therefore, the inversion layer 26 and the N-type semiconductor region 1 are electrically connected to each other and have the same electric potential, and the height of the potential of the inversion layer 26 becomes equal to the height of the potential of the N-type semiconductor region 1.

In the solid line 18, electrons generated at the deep position with respect to the first surface of the semiconductor substrate 11 are drawn from the P-type semiconductor region 2 (position E) distant from the inversion layer 26 to the inversion layer 26 (position F). When the electric charges come close to the inversion layer (position F), the electric charges receive an electric field more intense than the electric field in the position E and thus bring about avalanche amplification. In other words, avalanche amplification is caused at the inversion layer 26 by an intense electric field occurring between the inversion layer 26 and the P-type semiconductor region 2. An avalanche current generated at this time flows in the N-type semiconductor region 1 via the inversion layer 26. Then, the current is output as a signal via the wiring portion 4 connected to the control portion 202 illustrated in FIG. 2.

As mentioned above, when mathematical inequality (5) is satisfied, an intense electric field which causes avalanche amplification is not only an intense electric field of the PN junction at the first surface side of the semiconductor substrate 11 but also an intense electric field occurring between the inversion layer 26 and the P-type semiconductor region 2. Thus, according to a bias condition indicated by mathematical inequality (5), the inversion layer 26 and the N-type semiconductor region 1 are electrically connected to each other, and the inversion layer and the N-type semiconductor region 1 have the same electric potential. Then, electric charges generated at the deep portion of the semiconductor substrate 11 can bring about avalanche amplification at the inversion layer 26 without moving to the PN junction located in the vicinity of the first surface of the semiconductor substrate 11.

Moreover, in the case of the solid line 18, since an intense electric field occurs between the inversion layer 26 and the P-type semiconductor region 2, the dielectric member 7 becomes not dependent on the electric potential V2, and an effective electric potential applied to the dielectric member 7 located between the electrode 6 and the P-type semiconductor region 2 becomes about "(Vt−ϕt)−(V1−ϕ1)". Such a configuration enables generating an intense electric field while preventing dielectric breakdown of the dielectric member 7.

The description about a photoresponsivity performance in the second exemplary embodiment illustrated in FIG. 17 is similar to that in the first exemplary embodiment illustrated in FIG. 6 and is, therefore, omitted.

Example 1

Figure 7A:
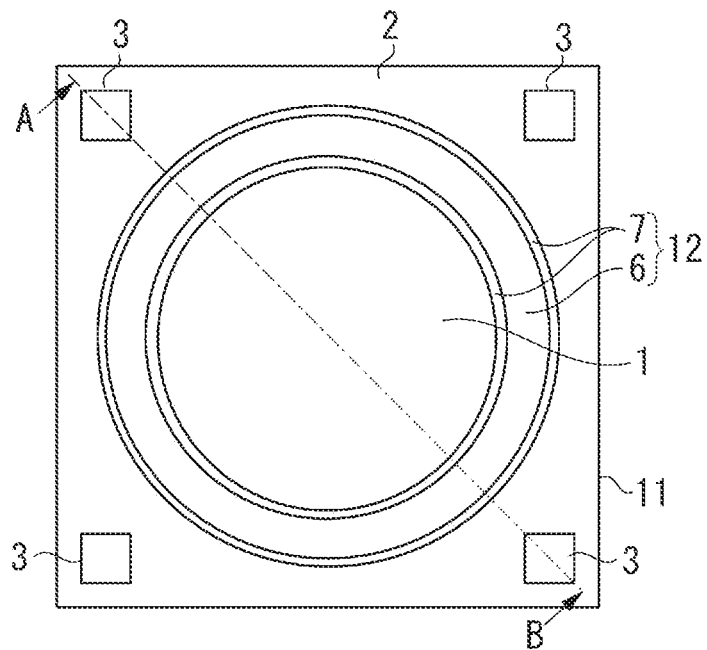
FIGS. 7A and 7B are a plan schematic view and a cross-sectional schematic view, respectively, of the photodetection device.
Figure 7B:
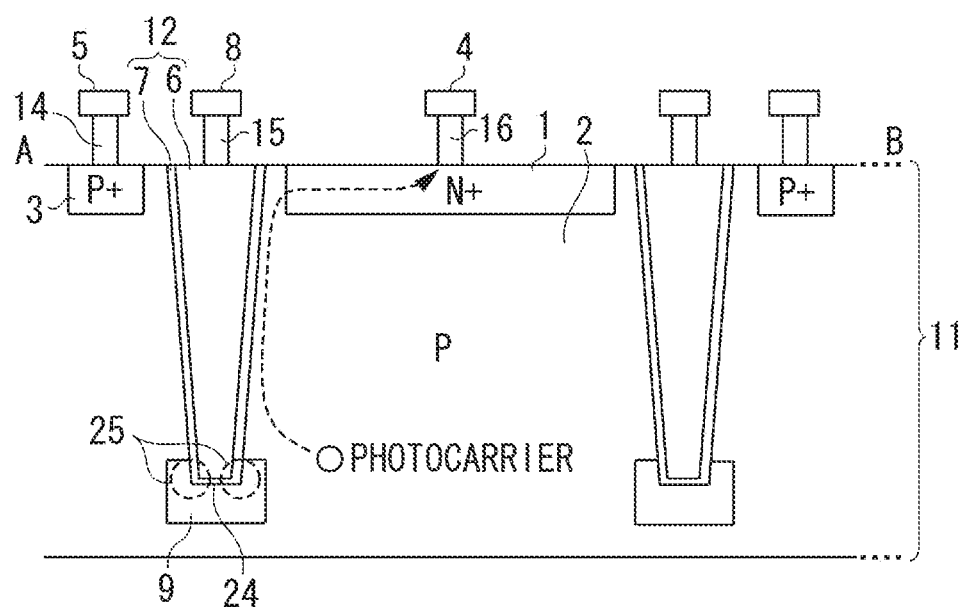

FIGS. 7A and 7B are a plan schematic view and a sectional view, respectively, of a photodetection device 10 according to Example 1. Portions having functions similar to those illustrated in FIG. 1 to FIG. 6 are assigned the respective same reference characters, and the detailed description thereof is omitted.

FIG. 7A is a plan schematic view of the photodetection device 10 according to Example 1. In the photodetection device 10, the N-type semiconductor region 1, the dielectric member 7, the electrode 6, the P-type semiconductor region 2, and the P-type semiconductor region 3 are arranged in the semiconductor substrate 11.

In planar view, the N-type semiconductor region 1 is arranged in such a way as to be enclosed by the buried portion 12, and the buried portion 12 is arranged in such a way as to be enclosed by the P-type semiconductor region 2.

Referring to FIG. 7A, in planar view, all of the regions between the N-type semiconductor region 1 and the P-type semiconductor region 2 serve as the buried portion 12. However, the buried portion 12 can be configured not to be provided at a part of the regions between N-type semiconductor region 1 and the P-type semiconductor region 2, and the N-type semiconductor region 1 and the P-type semiconductor region 2 can be configured to be in contact with each other at a portion in which the buried portion 12 is not provided.

In this case, electric field concentration may occur between the end portion of the N-type semiconductor region 1 and the P-type semiconductor region 2. Therefore, it is desirable that a guard ring be provided at a part of the side surface and the bottom surface of the N-type semiconductor region 1, which constitute the end portion of the N-type semiconductor region 1. Providing the guard ring enables restricting electric field concentration occurring at the end portion. For example, the guard ring is configured with an N-type semiconductor region or element isolation portion which is lower in impurity concentration than the N-type semiconductor region 1. This also applies to the following examples.

In the buried portion 12, in planar view, the electrode 6 is arranged in such a way as to be enclosed by two dielectric members 7.

In planar view, the P-type semiconductor region 3 is arranged in such a way as to be electrically connected to the P-type semiconductor region 2. Moreover, as long as the P-type semiconductor region 3 is electrically connected to the P-type semiconductor region 2, the P-type semiconductor region 3 can be arranged at the second surface side of the semiconductor substrate 11.

Furthermore, it is desirable that the N-type semiconductor region 1 be arranged in such a manner that the corner thereof is rounded in planar view as in the present example. According to such a shape, electric field concentration, which would occur at the corner, can be restricted.

FIG. 7B is an example of a cross-sectional schematic view of the photodetection device 10 taken along a line segment A-B in FIG. 7A. Referring to FIG. 7B, portions different from those in FIG. 3 are described.

In FIG. 7B, the buried portion 12 is arranged in such a way as to enclose a part of the P-type semiconductor region 2 located in the depth direction of the semiconductor substrate 11 with respect to the N-type semiconductor region 1. According to such a configuration, the surface area at which the dielectric member 7 of the buried portion 12 and the P-type semiconductor region 2 are in contact with each other becomes large. Then, the surface area of the semiconductor region in the vicinity of the side surface of the buried portion 12, to which electric charges generated at the deep portion of the semiconductor substrate 11 are drawn, increases. Moreover, in a case where a plurality of photoelectric conversion elements 101 is arranged, diffusive movement of electric charges to the surrounding photoelectric conversion elements 101 can be restricted. At this time, electric charge color mixture between pixels can be restricted.

In FIG. 7B, the buried portion 12 includes a bottom portion 24, which is an area located in the deepest position with respect to the first surface, a side surface, which is in contact with the P-type semiconductor region 2, and an end portion 25, which connects to the bottom portion 24 and the side surface. Furthermore, an N-type semiconductor region 9 (a third semiconductor region) is arranged in such a way as to be in contact with the bottom portion 24 and the end portion 25.

According to such a configuration, when an electric potential is supplied to the electrode 6, electric field concentration which would occur at the end portion 25 can be restricted. Then, an increase in dark signal, which is caused by an increase of, for example, a tunnel current via an impurity level at the electric field concentration portion, can be restricted.

Even with a configuration of the present example, the length of time required for detection of electric charges generated at the deep portion of the semiconductor substrate 11 can be reduced.

Example 2

Figure 8A:
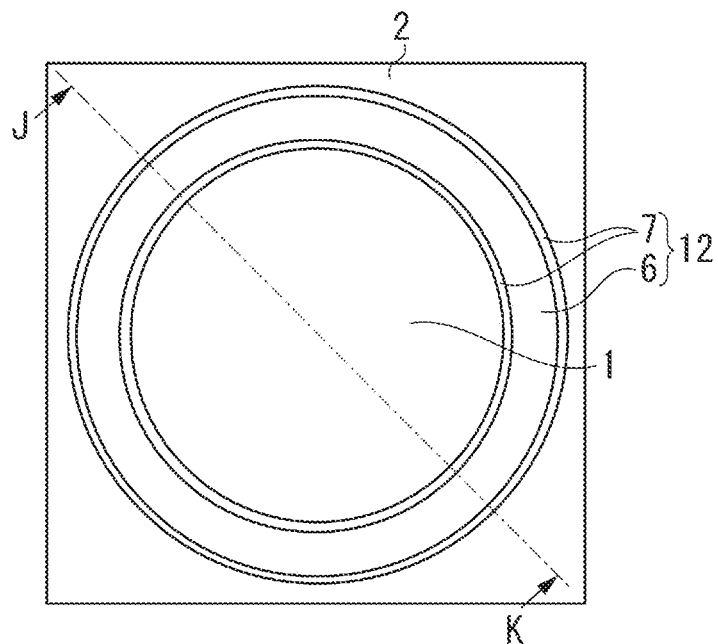
FIGS. 8A and 8B are a plan schematic view and a cross-sectional schematic view, respectively, of the photodetection device.
Figure 8B:
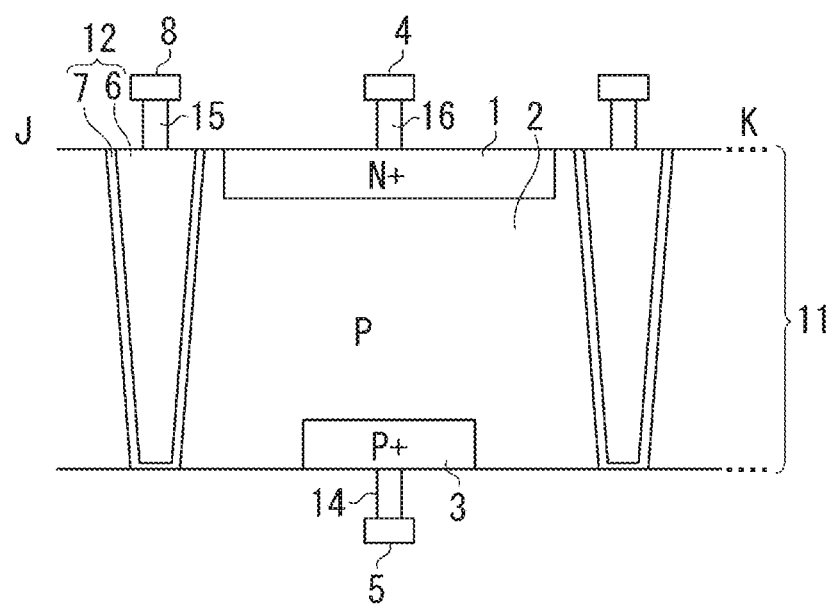

FIGS. 8A and 8B are a plan schematic view and a sectional view, respectively, of a photodetection device 10 according to Example 2. Portions having functions similar to those illustrated in FIG. 1 to FIGS. 7A and 7B are assigned the respective same reference characters, and the detailed description thereof is omitted.

FIG. 8A is a plan schematic view of the photodetection device 10 according to Example 2. FIG. 8A differs from FIG. 7A in that the P-type semiconductor region is not arranged at the first surface side of the semiconductor substrate 11.

FIG. 8B is a cross-sectional schematic view taken along a line segment JK in FIG. 8A. FIG. 8B differs from FIG. 7B in that the buried portion 12 is arranged to extend from the first surface of the semiconductor substrate 11 to the second surface of the semiconductor substrate 11. In FIG. 8B, the electrode 6 and the dielectric member 7 are arranged to extend from the first surface of the semiconductor substrate 11 to the second surface of the semiconductor substrate 11.

According to such a configuration, in a case where a plurality of photoelectric conversion elements 101 is arranged, an isolation performance for every photoelectric conversion element 101 can be improved. Then, color mixture of electric charges and color mixture caused by avalanche light emission can be restricted.

Furthermore, referring to FIG. 8B, the P-type semiconductor region 3, which is used to supply an electric potential to the P-type semiconductor region 2 constituting the PN junction together with the N-type semiconductor region 1, is arranged at the second surface side of the semiconductor substrate 11, and the contact plug 14 and the wiring portion 5 are arranged on the second surface of the semiconductor substrate 11. Then, an electric potential to be supplied to the P-type semiconductor region 2 and the P-type semiconductor region 3 is supplied via the second surface side of the semiconductor substrate 11.

According to such a configuration, the P-type semiconductor region 3 does not need to be arranged at the first surface side of the semiconductor substrate 11 so as to connect a contact plug for supplying an electric potential to the P-type semiconductor region 2. Then, the area of the photoelectric conversion element 101 can be reduced, and the density of pixels 100 can be increased.

Even with a configuration of the present example, the length of time required for detection of electric charges generated at the deep portion of the semiconductor substrate 11 can be reduced.

Example 3

Figure 9:
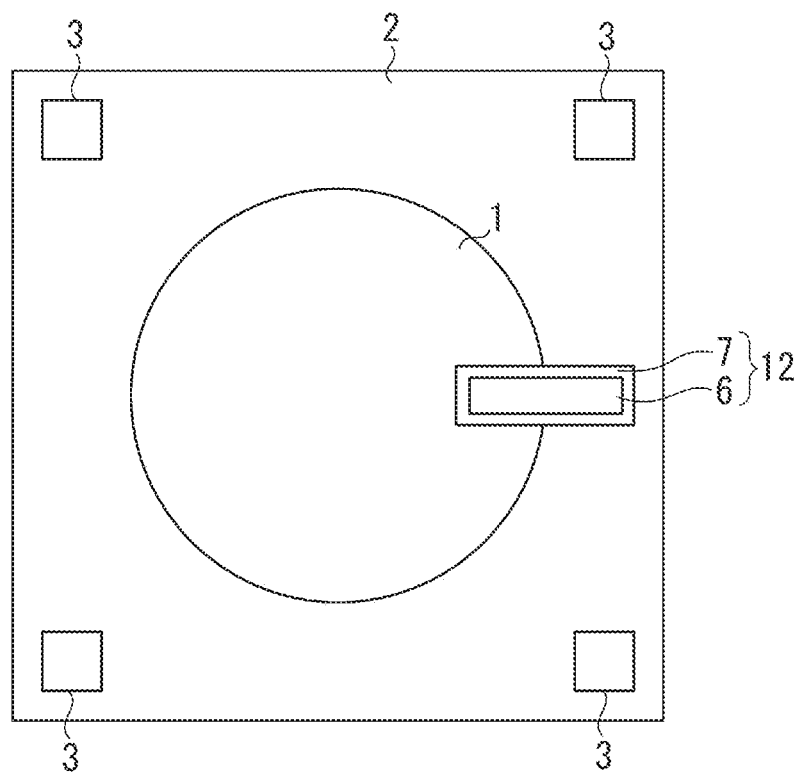
FIG. 9 is a plan schematic view of the photodetection device.

FIG. 9 is a plan schematic view of a photodetection device 10 according to Example 3. Portions having functions similar to those illustrated in FIG. 1 to FIGS. 8A and 8B are assigned the respective same reference characters, and the detailed description thereof is omitted.

FIG. 9 differs from FIG. 7A in the location of the buried portion 12. In FIG. 9, in planar view, the N-type semiconductor region 1 has a recessed portion, and the N-type semiconductor region 1 is arranged in such a way as to be enclosed by the P-type semiconductor region 2. Furthermore, in planar view, at least a part of the buried portion 12 is located in the recessed portion.

In FIG. 9, as long as a part of the buried portion 12 is in contact with the N-type semiconductor region 1, the shape of the buried portion 12 can be freely expanded so as to collect photocarriers generated at the deep portion in a wider planar region. Furthermore, in the present example, a plurality of buried portions 12 can be arranged.

Even with a configuration of the present example, the length of time required for detection of electric charges generated at the deep portion of the semiconductor substrate 11 can be reduced. The present example can also be applied to the other examples.

Example 4

Figure 10:
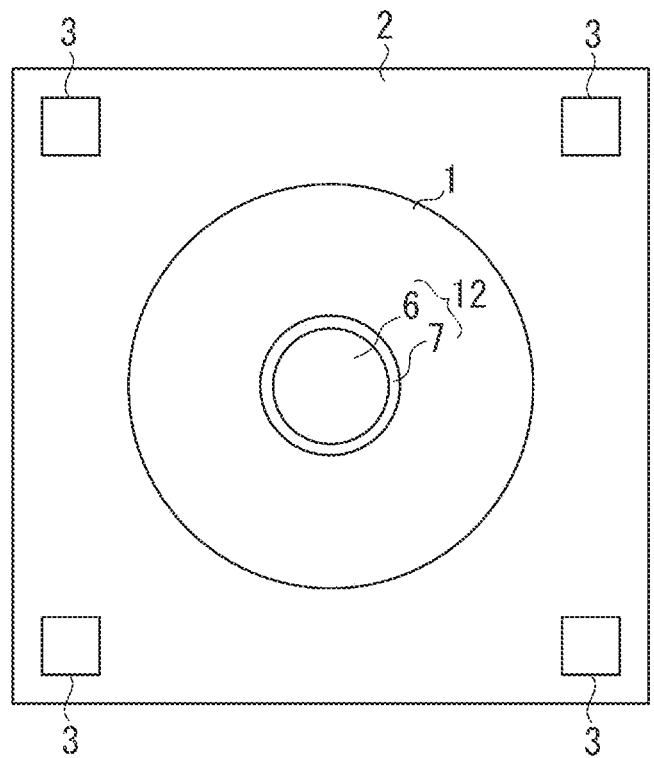
FIG. 10 is a plan schematic view of the photodetection device.
Figure 11:
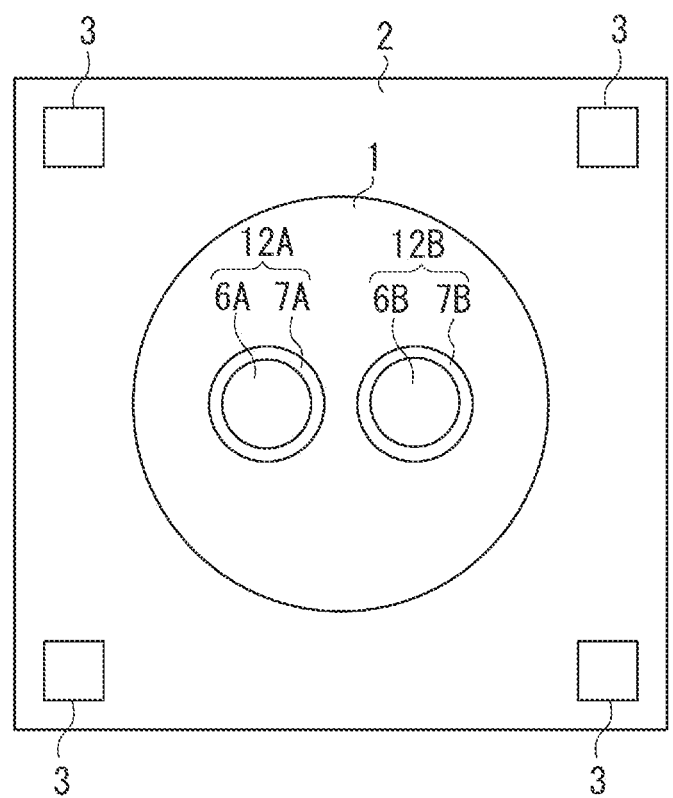
FIG. 11 is a plan schematic view of the photodetection device.

FIG. 10 and FIG. 11 are plan schematic views of a photodetection device 10 according to Example 4. Portions having functions similar to those illustrated in FIG. 1 to FIG. 9 are assigned the respective same reference characters, and the detailed description thereof is omitted.

In FIG. 10, in planar view, the buried portion 12 is arranged in such a way as to be enclosed by the N-type semiconductor region 1, and the N-type semiconductor region 1 is arranged in such a way as to be enclosed by the P-type semiconductor region 2.

FIG. 11, which is a modification of FIG. 10, illustrates a configuration in which, in planar view, a plurality of buried portions 12 is enclosed by the N-type semiconductor region 1. According to such a configuration, as compared with FIG. 10, the length of time required for detection of electric charges generated at the deep portion of the semiconductor substrate 11 can be further reduced.

Even with a configuration of the present example, the length of time required for detection of electric charges generated at the deep portion of the semiconductor substrate 11 can be reduced. The present example can also be applied to the other examples.

Example 5

Figure 18A:
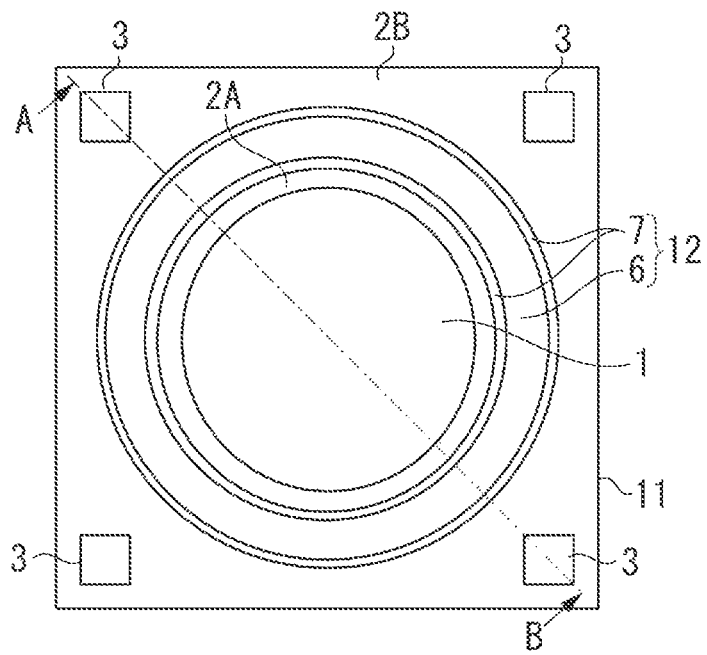
FIGS. 18A and 18B are a plan schematic view and a cross-sectional schematic view, respectively, of the photodetection device.
Figure 18B:
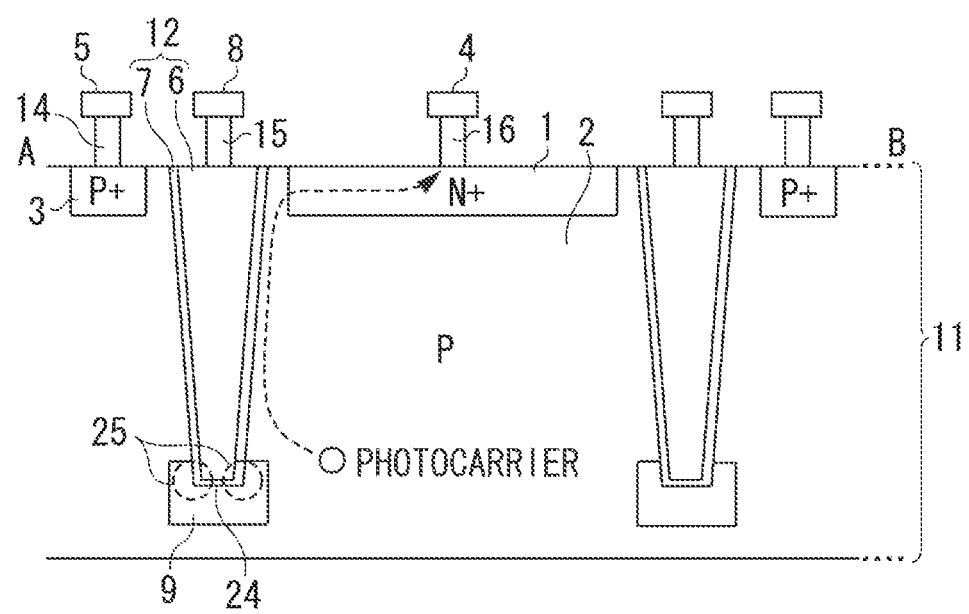

FIGS. 18A and 18B are a plan schematic view and a sectional view, respectively, of a photodetection device 10 according to Example 5. Portions having functions similar to those illustrated in the above-described figures are assigned the respective same reference characters, and the detailed description thereof is omitted.

FIG. 18A is a plan schematic view of the photodetection device 10 according to Example 5. In the photodetection device 10, the N-type semiconductor region 1, the dielectric member 7, the electrode 6, the P-type semiconductor region 2, and the P-type semiconductor region 3 are arranged in the semiconductor substrate 11.

In planar view, the P-type semiconductor region 2 has a first region 2A and a second region 2B, and the N-type semiconductor region 1 is arranged in such a way as to be enclosed by the first region 2A. Furthermore, in planar view, the first region 2A is arranged in such a way as to be enclosed by the buried portion 12, and the buried portion 12 is arranged in such a way as to be enclosed by the second region 2B.

Here, while, in planar view, the buried portion 12 is arranged in such a way as to enclose the entire circumference of the N-type semiconductor region 1 across the first region 2A, the buried portion 12 can only need to enclose at least a part of the circumference of the N-type semiconductor region 1. For example, the buried portion 12 can be configured not to be provided at a part of a space between the first region 2A and the second region 2B, and the N-type semiconductor region 1 and the P-type semiconductor region 2 can be configured to be in contact with each other at a portion in which the buried portion 12 is not provided.

In this case, electric field concentration may occur between the end portion of the N-type semiconductor region 1 and the P-type semiconductor region 2. Therefore, it is desirable that a guard ring be provided at a part of the side surface and the bottom surface of the N-type semiconductor region 1, which constitutes the end portion of the N-type semiconductor region 1. Providing the guard ring enables restricting electric field concentration occurring at the end portion. For example, the guard ring is configured with an N-type semiconductor region or element isolation portion which is lower in impurity concentration than the N-type semiconductor region 1. This also applies to the following examples. In the buried portion 12, in planar view, the electrode 6 is arranged in such a way as to be enclosed by two dielectric members 7.

In planar view, the P-type semiconductor region 3 is arranged in such a way as to be electrically connected to the P-type semiconductor region 2. Moreover, as long as the P-type semiconductor region 3 is electrically connected to the P-type semiconductor region 2, the P-type semiconductor region 3 can be arranged at the second surface side of the semiconductor substrate 11.

Furthermore, it is desirable that the N-type semiconductor region 1 be arranged in such a manner that the corner thereof is rounded in planar view as in the present example. According to such a shape, electric field concentration, which would occur at the corner, can be restricted.

FIG. 18B is an example of a cross-sectional schematic view of the photodetection device 10 taken along a line segment A-B in FIG. 18A. Referring to FIG. 18B, portions different from those in FIG. 14 are described.

In FIG. 18B, the buried portion 12 is arranged in such a way as to enclose the P-type semiconductor region 2 located in the depth direction of the semiconductor substrate with respect to the N-type semiconductor region 1. According to such a configuration, the surface area at which the dielectric member 7 of the buried portion 12 and the P-type semiconductor region 2 are in contact with each other becomes large. Then, the surface area of the inversion layer 26, to which electric charges generated at the deep portion of the semiconductor substrate 11 are drawn, increases. Moreover, in a case where a plurality of photoelectric conversion elements 101 is arranged, diffusive movement of electric charges to the surrounding photoelectric conversion elements 101 can be restricted. At this time, electric charge color mixture between pixels can be restricted.

Furthermore, in FIG. 18B, the buried portion 12 includes a bottom portion 24, which is an area located in the deepest position with respect to the first surface, a side surface, which is in contact with the P-type semiconductor region 2, and an end portion 25, which connects to the bottom portion 24 and the side surface. Then, an N-type semiconductor region 9 (a third semiconductor region) is arranged in such a way as to be in contact with the bottom portion 24 and the end portion 25.

According to such a configuration, when an electric potential is supplied to the electrode 6, electric field concentration which would occur at the end portion 25 can be restricted. Then, an increase in dark signal, which is caused by an increase of, for example, a tunnel current via an impurity level at the electric field concentration portion, can be restricted.

Even with a configuration of the present example, the length of time required for detection of electric charges generated at the deep portion of the semiconductor substrate 11 can be reduced.

Example 6

Figure 19A:
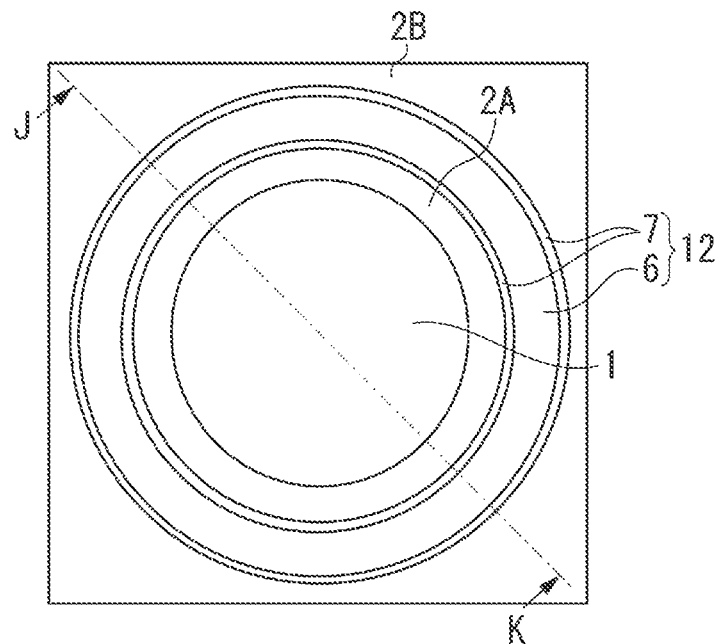
FIGS. 19A and 19B are a plan schematic view and a cross-sectional schematic view, respectively, of the photodetection device.
Figure 19B:
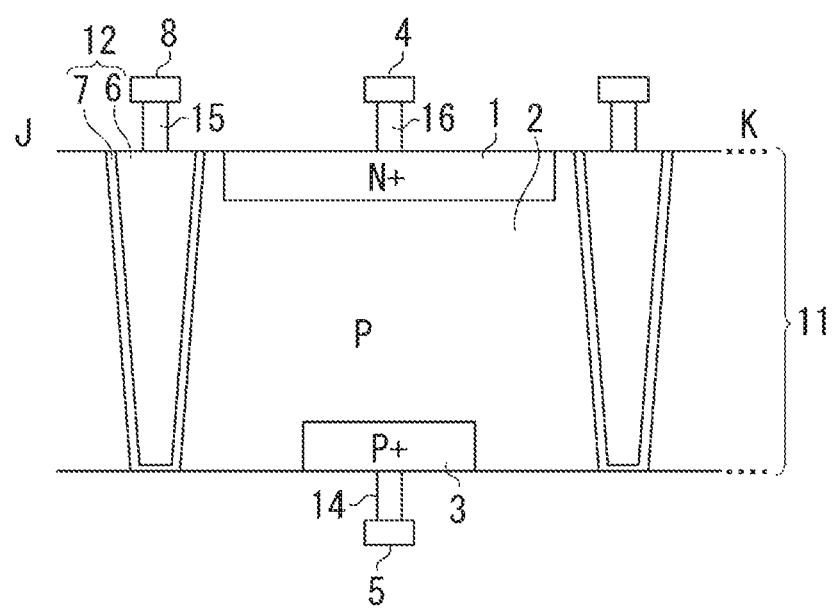

FIGS. 19A and 19B are a plan schematic view and a sectional view, respectively, of a photodetection device 10 according to Example 6. Portions having functions similar to those illustrated in the above-described figures are assigned the respective same reference characters, and the detailed description thereof is omitted.

FIG. 19A is a plan schematic view of the photodetection device 10 according to Example 6. FIG. 19A differs from FIG. 18A in that the P-type semiconductor region is not arranged at the first surface side of the semiconductor substrate 11.

FIG. 19B is a cross-sectional schematic view taken along a line segment JK in FIG. 19A. FIG. 19B differs from FIG. 18B in that the buried portion 12 is arranged to extend from the first surface of the semiconductor substrate 11 to the second surface of the semiconductor substrate 11. In FIG. 19B, the electrode 6 and the dielectric member 7 are arranged to extend from the first surface of the semiconductor substrate 11 to the second surface of the semiconductor substrate 11.

According to such a configuration, in a case where a plurality of photoelectric conversion elements 101 is arranged, an isolation performance for every photoelectric conversion element 101 can be improved. Then, color mixture of electric charges and color mixture caused by avalanche light emission can be restricted.

Furthermore, referring to FIG. 19B, the P-type semiconductor region 3, which is used to supply an electric potential to the P-type semiconductor region 2 constituting the PN junction together with the N-type semiconductor region 1, is arranged at the second surface side of the semiconductor substrate 11, and the contact plug 14 and the wiring portion 5 are arranged on the second surface of the semiconductor substrate 11. Then, an electric potential to be supplied to the P-type semiconductor region 2 and the P-type semiconductor region 3 is supplied via the second surface side of the semiconductor substrate 11.

According to such a configuration, the P-type semiconductor region 3 does not need to be arranged at the first surface side of the semiconductor substrate 11 so as to connect a contact plug for supplying an electric potential to the P-type semiconductor region 2. Then, the area of the photoelectric conversion element 101 can be reduced, and the density of pixels 100 can be increased.

Even with a configuration of the present example, the length of time required for detection of electric charges generated at the deep portion of the semiconductor substrate 11 can be reduced.

Example 7

Figure 20:
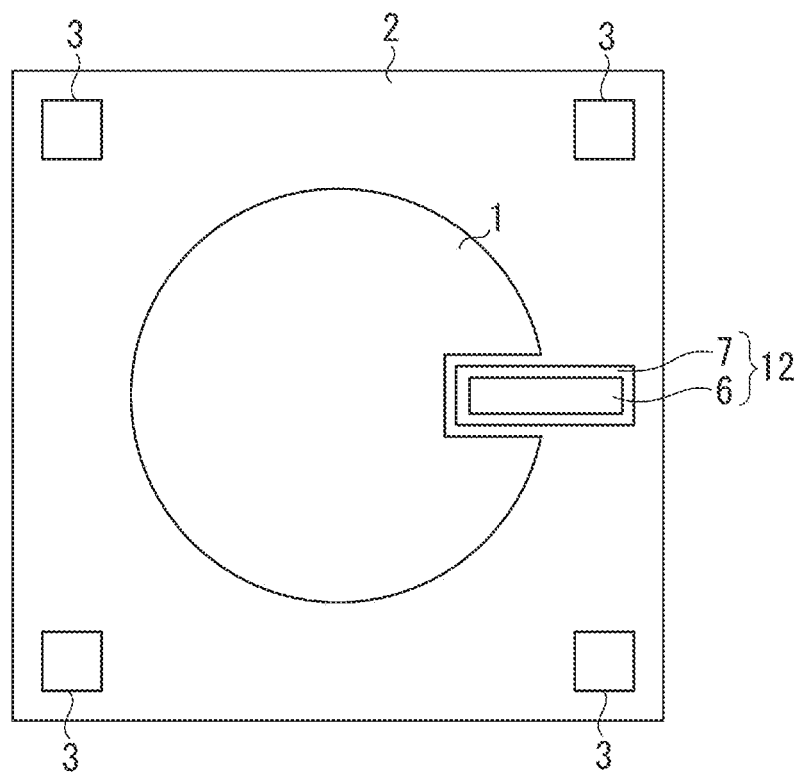
FIG. 20 is a plan schematic view of the photodetection device.

FIG. 20 is a plan schematic view of a photodetection device 10 according to Example 7. Portions having functions similar to those illustrated in the above-described figures are assigned the respective same reference characters, and the detailed description thereof is omitted.

FIG. 20 differs from FIG. 18A in the location of the buried portion 12. In FIG. 20, in planar view, the N-type semiconductor region 1 has a recessed portion, and the N-type semiconductor region 1 is arranged in such a way as to be enclosed by the P-type semiconductor region 2. Furthermore, in planar view, the buried portion 12 is arranged in such a way as to be enclosed by the P-type semiconductor region 2, and a part of the P-type semiconductor region 2 and at least a part of the buried portion 12 is located in the recessed portion.

In FIG. 20, as long as a part of the buried portion 12 is able to be electrically connected to the N-type semiconductor region 1, the shapes of the recessed portion of the N-type semiconductor region 1 and the buried portion 12 can be freely expanded so as to collect photocarriers generated at the deep portion of the semiconductor substrate 11 in a wider planar region. Furthermore, in the present example, a plurality of buried portions 12 can be arranged.

Even with a configuration of the present example, the length of time required for detection of electric charges generated at the deep portion of the semiconductor substrate 11 can be reduced. The present example can also be applied to the other examples.

Example 8

Figure 21:
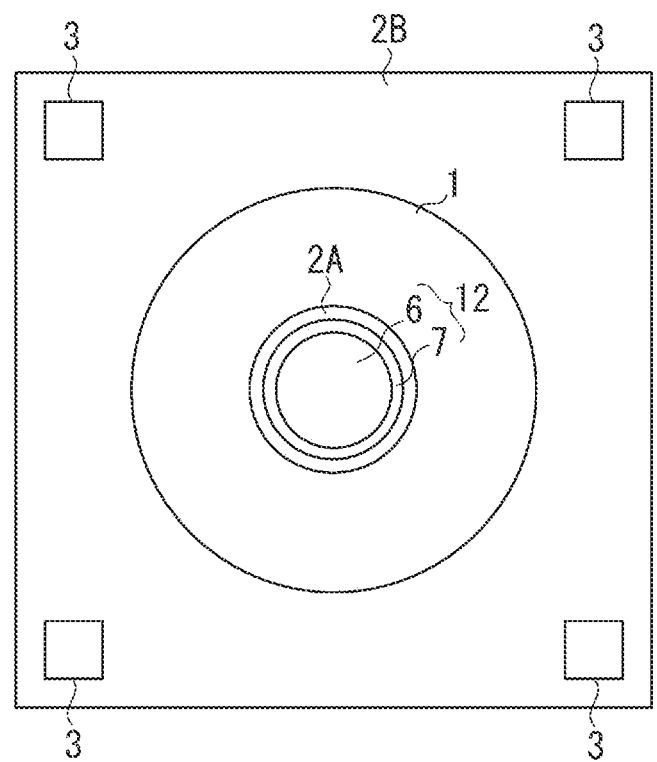
FIG. 21 is a plan schematic view of the photodetection device.
Figure 22:
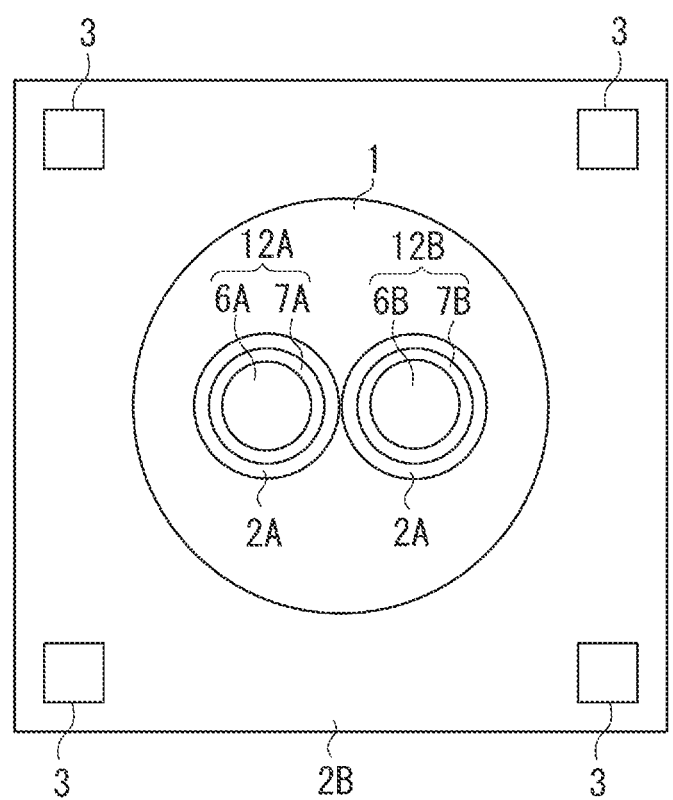
FIG. 22 is a plan schematic view of the photodetection device.

FIG. 21 and FIG. 22 are plan schematic views of a photodetection device 10 according to Example 8. Portions having functions similar to those illustrated in the above-described figures are assigned the respective same reference characters, and the detailed description thereof is omitted.

In FIG. 21, in planar view, the P-type semiconductor region has a first region 2A and a second region 2B. In planar view, the buried portion 12 is arranged in such a way as to be enclosed by the first region 2A, and the first region 2A is arranged in such a way as to be enclosed by the N-type semiconductor region 1. Furthermore, in planar view, the N-type semiconductor region 1 is arranged in such a way as to be enclosed by the second region 2B.

Even with a configuration of the present example, the length of time required for detection of electric charges generated at the deep portion of the semiconductor substrate 11 can be reduced. Furthermore, according to a configuration of the present example, the planar area of the buried portion 12 can be decreased.

FIG. 22, which is a modification of FIG. 21, illustrates a configuration in which a plurality of buried portions illustrated in FIG. 21 is arranged. According to such a configuration, as compared with FIG. 21, the length of time required for detection of electric charges generated at the deep portion of the semiconductor substrate 11 can be further reduced. The present example can also be applied to the other examples.

Example 9

In Example 9, an example of a photodetection system using the photodetection device 10 according to each example is described. An invisible light detection system and a medical diagnosis system, such as positron emission tomography (PET), each of which is an example of the photodetection system, are described with reference to FIG. 12. Portions having functions similar to those illustrated in the above-described figures are assigned the respective same reference characters, and the detailed description thereof is omitted.

Figure 12:
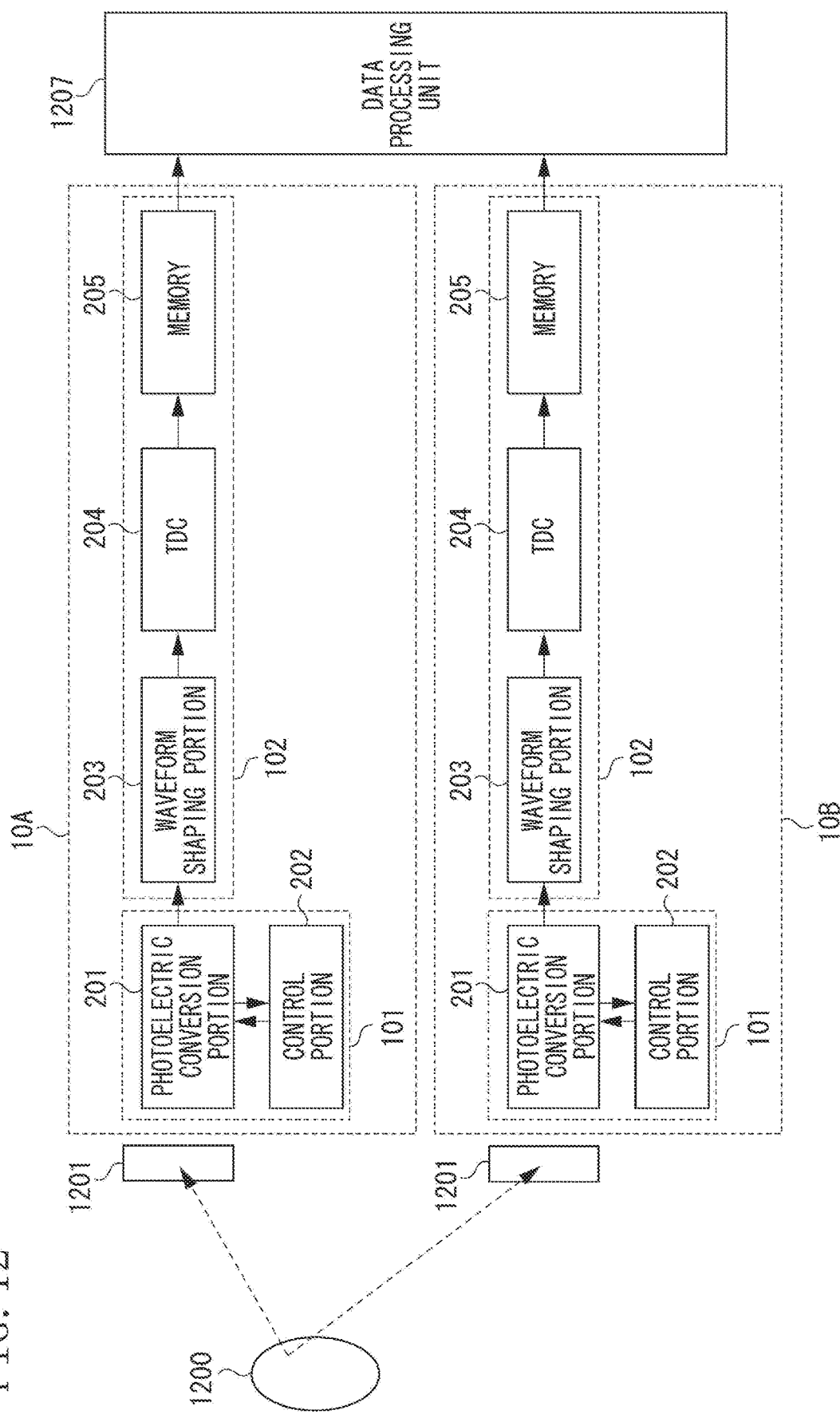
FIG. 12 is a block diagram of a photodetection system.

FIG. 12 is a block diagram illustrating a configuration of the invisible light detection system. The invisible light detection system includes wavelength conversion units 1201, a data processing unit 1207, and a plurality of photodetection devices 10.

A radiation object 1200 radiates light of a waveband serving as invisible light. The wavelength conversion unit 1201 receives the light of a waveband serving as invisible light radiated from the radiation object 1200 and radiates visible light.

The photoelectric conversion portion 201 receives the visible light radiated from the wavelength conversion unit 1201 and performs photoelectric conversion on the received light, and the photodetection device 10 stores, in the memory 205, a digital signal which is based on the photoelectrically converted electric charges and generated via the control portion 202, the waveform shaping portion 203, and the TDC 204. The plurality of photodetection devices 10 can be formed as a single device or can be formed with a plurality of devices arranged.

A plurality of digital signals stored in the memories 205 of the plurality of photodetection devices 10 is subjected to signal processing by the data processing unit 1207. Here, the signal processing includes synthetic processing of a plurality of images obtained from the plurality of digital signals.

Next, a configuration of a medical diagnosis system, such as positron emission tomography (PET), which is a specific example of the invisible light detection system, is described.

A subject serving as the radiation object 1200 emits radiation pairs from the living body thereof. The wavelength conversion unit 1201 configures a scintillator, and the scintillator receives the radiation pairs emitted from the subject and then radiates visible light.

The photoelectric conversion portion 201 receives the visible light radiated from the scintillator and performs photoelectric conversion on the received light, and the photodetection device 10 stores, in the memory 205, a digital signal which is based on the photoelectrically converted electric charges and generated via the control portion 202, the waveform shaping portion 203, and the TDC 204. In other words, the photodetection device 10 is arranged to detect the arrival time of the radiation pairs emitted from the subject, detects the visible light radiated from the scintillator, and stores a digital signal in the memory 205.

A plurality of digital signals stored in the memories 205 of the plurality of photodetection devices 10 is subjected to signal processing by the data processing unit 1207. Here, the signal processing includes synthetic processing, such as image reconstruction, using a plurality of images obtained from the plurality of digital signals and thus forming an image of the inside of the living body of the subject.

Example 10

In Example 10, an example of a photodetection system using the photodetection device 10 according to each example is described. In the present example, a distance detection system, which is an example of the photodetection system, is described with reference to FIG. 13. Portions having functions similar to those illustrated in the above-described figures are assigned the respective same reference characters, and the detailed description thereof is omitted.

Figure 13:
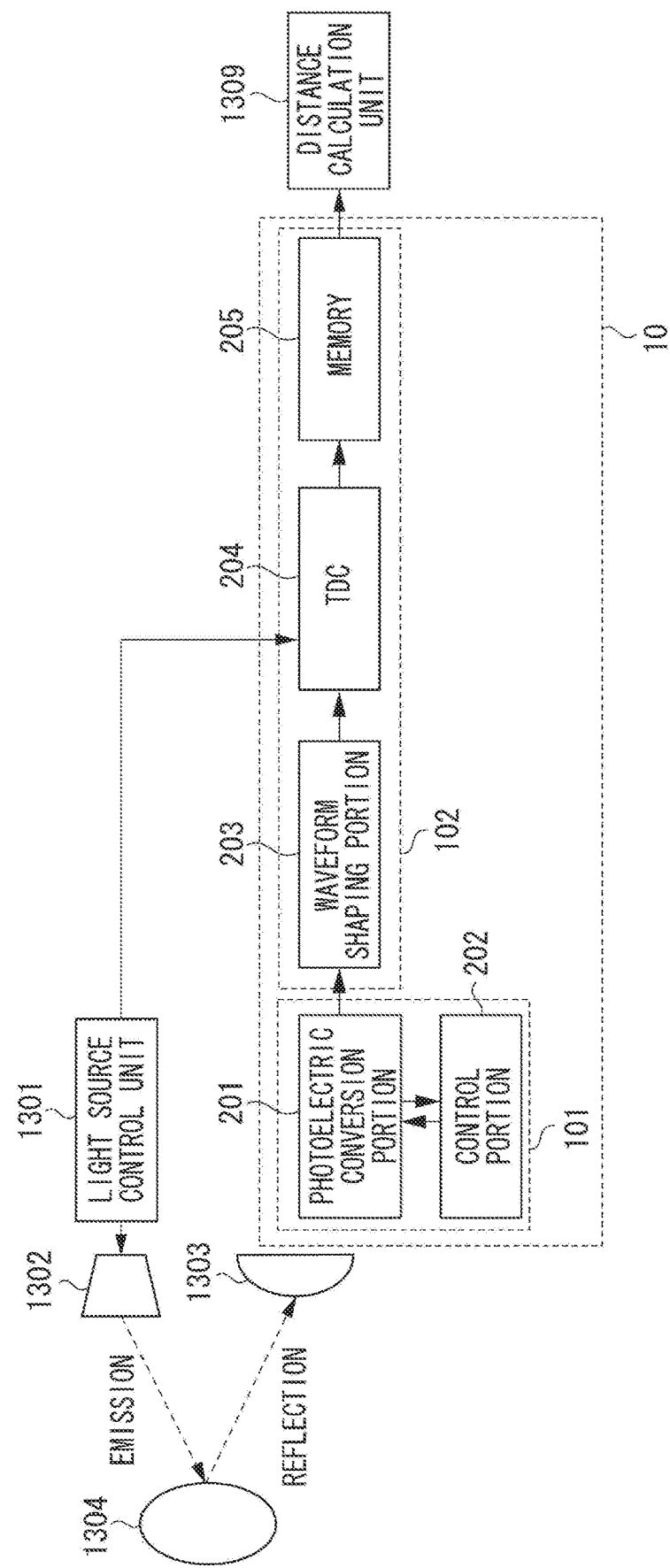
FIG. 13 is a block diagram of a photodetection system.

FIG. 13 is an example of a block diagram of the distance detection system according to the present example. The distance detection system includes a light source control unit 1301, a light emission unit 1302, an optical member 1303, a photodetection device 10, and a distance calculation unit 1309.

The light source control unit 1301 controls driving of the light emission unit 1302. Upon receiving a signal from the light source control unit 1301, the light emission unit 1302 radiates light of short pulses (train) in a shooting direction.

The light radiated from the light emission unit 1302 is reflected by an object 1304. The reflected light passes through the optical member 1303 and is then received by the photoelectric conversion portion 201 of the photodetection device 10, and a signal which is based on the photoelectrically converted electric charges is input to the TDC 204 via the waveform shaping portion 203.

The TDC 204 compares a signal obtained from the light source control unit 1301 with a signal input from the waveform shaping portion 203. Then, the TDC 204 performs high-precision digital conversion on the time required from when the light emission unit 1302 emits pulse light until the reflected light from the object 1304 is received. A digital signal output from the TDC 204 is stored in the memory 205.

The distance calculation unit 1309 calculates a distance from the photodetection device 10 to the object 1304 based on digital signals obtained by a plurality of detecting operations and stored in the memory 205.

The distance detection system described above can be applied to, for example, vehicle equipment.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2016-150330, filed Jul. 29, 2016, and 2016-150331, filed Jul. 29, 2016, which are hereby incorporated by reference herein in their entirety.

What is claimed is:

1. A photodetection device comprising:
   a substrate having a first surface and a second surface which is opposite to the first surface;
   a first semiconductor region of a first conductivity type including a majority carrier of a polarity of a signal charge, the first semiconductor region being arranged in a first depth of the substrate;
   a second semiconductor region of a second conductivity type having different conductivity from the first conductivity type, the second semiconductor region being arranged in a second depth greater than the first depth from the first surface; and
   a trench structure with polysilicon formed in the substrate from the first surface toward the second surface, the trench structure including a first trench structure portion and a second trench structure portion,
   wherein the first semiconductor region is arranged between the first trench structure portion and the second trench structure portion in a cross section passing through the first semiconductor region and the second semiconductor region,
   wherein a semiconductor region of the second conductivity type is arranged between the first trench structure portion and the second surface and between the second trench structure portion and the second surface in the cross section, and
   wherein a third semiconductor region of the first conductivity type is arranged between an end portion of the first trench structure portion and an end portion of the second trench structure portion.

2. The photodetection device according to claim 1, wherein a contact plug is arranged at the first surface side and arranged in a region overlapped with the first semiconductor region.

3. The photodetection device according to claim 2, wherein the polysilicon is a second conductivity doped polysilicon.

4. The photodetection device according to claim 2, wherein the trench structure is a deep trench isolation.

5. The photodetection device according to claim 2, wherein the trench structure is arranged to a depth of at least half of a depth of the substrate.

6. The photodetection device according to claim 4, wherein the polysilicon is buried in the trench structure.

7. The photodetection device according to claim 6, wherein the first semiconductor region is included in an avalanche diode.

8. The photodetection device according to claim 7, wherein the first semiconductor region is surrounded by the trench structure in a plan view.

9. The photodetection device according to claim 8, further comprising a counter circuit which counts a signal of the avalanche diode.

10. The photodetection device according to claim 8, wherein a fourth semiconductor region of the second conductivity type is arranged between the first semiconductor region and the trench structure.

11. The photodetection device according to claim 10, wherein the distance between the first semiconductor region and the trench structure is 0.1 μm or less.

12. The photodetection device according to claim 11, wherein a plurality of the first semiconductor regions are arranged in the substrate in a row direction and a column direction.

13. The photodetection device according to claim 2, wherein the second semiconductor region is arranged between the first trench structure portion and the second trench structure portion in the cross section.

14. A photodetection system comprising:
   the photodetection device according to claim 1;
   a light emission unit configured to emit light to be detected by the photodetection device; and
   a distance calculation unit configured to perform distance calculation using a digital signal stored by the photodetection device.

15. A photodetection system comprising:
   the photodetection device according to claim 12;
   a light emission unit configured to emit light to be detected by the photodetection device; and
   a distance calculation unit configured to perform distance calculation using a digital signal stored by the photodetection device.

16. The photodetection device according to claim 1, wherein the third semiconductor region is arranged between a bottom portion of the first trench structure portion and the second surface.

* * * * *